United States Patent
Masuda

(10) Patent No.: US 9,461,080 B2
(45) Date of Patent: Oct. 4, 2016

(54) SEMICONDUCTOR DEVICE FOR RADIATION DETECTION

(71) Applicant: SHARP KABUSHIKI KAISHA, Osaka-shi, Osaka (JP)

(72) Inventor: Ryohichi Masuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/906,661

(22) PCT Filed: Jun. 23, 2014

(86) PCT No.: PCT/JP2014/003356
§ 371 (c)(1),
(2) Date: Jan. 21, 2016

(87) PCT Pub. No.: WO2015/015700
PCT Pub. Date: Feb. 5, 2015

(65) Prior Publication Data
US 2016/0172396 A1    Jun. 16, 2016

(30) Foreign Application Priority Data
Aug. 2, 2013   (JP) .................................. 2013-161514

(51) Int. Cl.
*H01L 31/062*    (2012.01)
*H01L 31/113*    (2006.01)
(Continued)

(52) U.S. Cl.
CPC ... *H01L 27/14614* (2013.01); *H01L 27/14609* (2013.01); *H01L 27/14616* (2013.01); *H01L 27/14643* (2013.01); *H01L 29/0649* (2013.01); *H01L 29/78391* (2014.09);
(Continued)

(58) Field of Classification Search
CPC ................................................ H01L 27/1443
USPC .................................................. 257/291, 292
See application file for complete search history.

(56) References Cited

U.S. PATENT DOCUMENTS

| 4,954,895 A | 9/1990 | Akimoto et al. |
| 5,440,130 A * | 8/1995 | Cox ................ G01T 1/2018 |
| | | 250/370.09 |

(Continued)

FOREIGN PATENT DOCUMENTS

| JP | H01147861 A | 6/1989 |
| JP | 11-87718 A | 3/1999 |

(Continued)

*Primary Examiner* — Lex Malsawma
*Assistant Examiner* — Eric Jones
(74) *Attorney, Agent, or Firm* — Birch, Stewart, Kolasch & Birch, LLP

(57) ABSTRACT

Variation in threshold voltages in a device operation is reduced.
An insulator layer which is disposed to be opposed to a channel region 41 of a MOS transistor and is formed to have a laminated structure of a silicon nitride film 83 and a silicon oxide film 83 and an inverted signal input unit which inputs a signal obtained by inverting an input signal inputted into a source region 43 of a MOS transistor into a channel region 41 are provided and the inverted signal input unit includes another gate electrode 82 which is formed on an extended portion of the channel region 41 of the gate electrode 81 in a manner to be adjacent to the gate electrode 81 of the MOS transistor and a CMOS circuit 80 which inverts an input signal inputted into the source region 43 of the MOS transistor in accordance with an input value of the input signal and inputs a signal obtained through inversion in the CMOS circuit 80 into another gate electrode 82.

6 Claims, 8 Drawing Sheets

(51) Int. Cl.
  *H01L 27/146*  (2006.01)
  *H01L 29/786*  (2006.01)
  *H01L 29/78*   (2006.01)
  *H01L 29/06*   (2006.01)
  *H01L 31/117*  (2006.01)

(52) U.S. Cl.
  CPC .. *H01L 29/78603* (2013.01); *H01L 29/78624* (2013.01); *H01L 29/78645* (2013.01); *H01L 29/78648* (2013.01); *H01L 31/117* (2013.01)

(56) References Cited

U.S. PATENT DOCUMENTS

| | | | | |
|---|---|---|---|---|
| 5,898,332 | A * | 4/1999 | Lefevre | G06G 7/184 327/336 |
| 6,583,828 | B1 * | 6/2003 | Wada | G02F 1/136213 349/38 |
| 7,173,302 | B2 * | 2/2007 | Brederlow | H01L 21/84 257/296 |
| 9,209,209 | B2 * | 12/2015 | Hirose | G01J 1/46 |
| 2003/0042519 | A1 * | 3/2003 | Tzeng | H01L 27/10829 257/296 |
| 2006/0125038 | A1 | 6/2006 | Mabuchi | |
| 2009/0324245 | A1 * | 12/2009 | Fertig | G06F 1/04 398/155 |
| 2010/0193893 | A1 | 8/2010 | Meinhardt et al. | |
| 2011/0049589 | A1 * | 3/2011 | Chuang | H01L 27/14609 257/292 |
| 2012/0195106 | A1 * | 8/2012 | Wang | G11C 11/418 365/154 |
| 2015/0104198 | A1 * | 4/2015 | Dorren | H04L 7/0276 398/202 |

FOREIGN PATENT DOCUMENTS

| | | |
|---|---|---|
| JP | 2002-124657 A | 4/2002 |
| JP | 2002-246580 A | 8/2002 |
| JP | 2002-314061 A | 10/2002 |
| JP | 2006-173351 A | 6/2006 |
| JP | 2008-543096 A | 11/2008 |
| JP | 2010-056512 A | 3/2010 |
| JP | 2010-093550 A | 4/2010 |
| JP | 2011-061521 A | 3/2011 |

* cited by examiner

SEMICONDUCTOR DEVICE FOR RADIATION DETECTION

TECHNICAL FIELD

The present invention relates to a semiconductor device for radiation detection in which a radiation detection element and a read circuit for the radiation detection element are formed on one silicon-on-insulator (SOI) substrate in a manner to be separated from each other by an insulation film and active elements such as a MOS transistor constituting this read circuit and passive elements such as a resistor and a capacitor are mounted.

BACKGROUND ART

A radiation detection element detects radiation and is used in fields of nuclear medicine, nuclear power, astronomy, cosmic-ray physics, and the like, for example. Here, radiation includes an alpha ray, a beta ray, a gamma ray, an X-ray, a neutron beam, a charged particle beam, and the like.

A conventional pixel type radiation detector employs such connection configuration that a sensor portion which performs photoelectric conversion and a read circuit portion which reads a signal charge from this sensor portion are produced as individual chips and electrical connection between respective chips is performed by electrical connection using a metal bump.

However, in order to electrically connect these two chips, joining with excessively large number of metal bumps is required, so that the thickness is increased and a mounting cost is also increased.

In PTL 1, a conventional CMOS image sensor is proposed. In this conventional CMOS image sensor, the silicon-on-insulator (SOI) structure which has a laminated structure of a single-crystal silicon layer/an insulator layer/a thick single-crystal silicon layer in which a thin single-crystal silicon layer is formed on a silicon substrate with an insulator layer interposed therebetween is employed.

On this conventional CMOS image sensor, a photodiode which is formed on a P-type silicon substrate from which an embedded oxide layer is removed and a read circuit which includes an amplifying transistor which reads and amplifies signal charges which are photoelectrically converted in the photodiode and accumulated are mounted.

If a radiation detection element and a read circuit can be integrated by using a technique in which an electronic circuit is constructed on one SOI substrate, in which an insulation silicon oxide film (an insulator layer) is formed on a silicon substrate and a silicon layer is further provided on the insulation silicon oxide film as PTL 1, enhancement of an S/N ratio brought by reduction of metal bumps and parasitic capacitance of wirings and increase in a reading speed brought by shortening of the wiring length can be expected.

However, such SOI substrate has such problem that threshold value variation caused by variation in film thicknesses of the SOI layer is generated. A read circuit is composed of an analog circuit, so that if there is variation in threshold values in a MOS transistor, a problem of characteristic variation arises.

Therefore, in PTL 2, such description is provided that an insulator layer provided under a gate electrode to be opposed to a channel region of a MOS transistor is formed to have a laminated structure composed of a silicon oxide film and a silicon nitride film and charges are accumulated in this laminated structure portion so as to adjust threshold value variation caused by film-thickness variation of an SOI layer.

CITATION LIST

Patent Literature

PTL 1: Japanese Unexamined Patent Application Publication No. 2002-124657
PTL 2: Japanese Unexamined Patent Application Publication No. 11-87718

SUMMARY OF INVENTION

Technical Problem

A measure against variation in threshold values in PTL 2 is led by film-thickness fluctuation (film-thickness variation) of the SOI layer. This film-thickness variation is variation which is originally exhibited by a device. Therefore, variation in threshold values can be corrected by forming an insulator layer under a gate electrode as a laminated structure as PTL 2. However, this variation in threshold values occurs in an operation of the device as well.

For example, if a source potential Vs transits from a high level (H) to a low level (L) while maintaining a gate voltage Vg at the high level (H), such phenomenon arises that a potential of a channel region, which is in a floating state, is also lowered in a similar manner to the source potential Vs due to coupling capacitance which exists between the channel region and a source region.

Such reduction of the potential of the channel region leads effective increase of a threshold value of a MOS transistor. Consequently, a response characteristic of a circuit varies. In particular, when a threshold value is increased, the response characteristic of a circuit often tends to become slow. An analog circuit such as an amplifier is sensitive to fluctuation of a threshold value and a frequency characteristic, settling time, and the like are affected by the fluctuation.

The present invention solves the above-mentioned conventional problems and an object of the present invention is to provide a semiconductor device for radiation detection which is capable of reducing variation in threshold voltages during an operation of a device as well.

Solution to Problem

A semiconductor device for radiation detection according to the present invention, which has a silicon-on-insulator (SOI) structure in which a first semiconductor layer or a semiconductor substrate is disposed on a lower surface of an insulator layer and a second semiconductor layer is disposed on an upper surface of the insulator layer, in which a radiation detection element is formed on the first semiconductor layer or the semiconductor substrate, and in which a read circuit which processes a signal charge, which is detected in the radiation detection element, and includes at least a MOS transistor is formed on the second semiconductor layer, includes an inverted signal input unit which inputs a signal obtained by inverting an input signal inputted into one drive region of the MOS transistor into a channel region of the MOS transistor. In the semiconductor device for radiation detection, a part or a whole of the insulator layer which is disposed to be opposed to the channel region of the MOS transistor is formed to have a laminated structure of a silicon oxide film or a film which traps and holds an electron or a hole equivalently to the silicon oxide film and a film which traps an electron or a hole more easily than the silicon oxide film. Accordingly, the above-mentioned object is attained.

Further, in the semiconductor device for radiation detection according to the present invention, preferably, the inverted signal input unit may include another gate electrode which is formed on an extended portion of a channel region of a gate electrode of the MOS transistor in a manner to be adjacent to the gate electrode and a CMOS circuit which inverts an input signal inputted into one drive region of the MOS transistor by each predetermined voltage in accordance with an input value of the input signal, and input a voltage signal obtained through inversion in the CMOS circuit into the another gate electrode.

Further, in the semiconductor device for radiation detection according to the present invention, preferably, the inverted signal input unit may input an input signal to be inputted into a source region of the MOS transistor also into a capacitor means so as to input an obtained inverted signal from the capacitor means into the channel region.

Further, in the semiconductor device for radiation detection according to the present invention, preferably, a ferroelectric film which has a dielectric polarization characteristic may be disposed to be opposed to the channel region of the MOS transistor, as the inverted signal input unit constituted with the laminated structure or instead of the laminated structure.

Further, in the semiconductor device for radiation detection according to the present invention, preferably, an electrode film may be disposed in an inside of the insulator layer, which is opposed to the laminated structure with a channel region interposed, as the inverted signal input unit constituted with the laminated structure and a signal which is obtained by inverting an input signal, which is inputted into one drive region of the MOS transistor, may be inputted into the channel region by an insulator layer on a side of the channel region from the electrode film, which is provided in the inside of the insulator layer.

Further, in the semiconductor device for radiation detection according to the present invention, preferably, a back gate electrode of the second semiconductor layer and the source region may be connected with each other with a diffusion resistance layer interposed so that a potential can be supplied.

Further, in the semiconductor device for radiation detection according to the present invention, preferably, a high-concentration impurity diffusion layer, which is formed by additionally introducing an impurity to increase the impurity concentration, may be provided to a part or the whole, on the side of another gate electrode, of the channel region which is opposed to another gate electrode.

Further, in the semiconductor device for radiation detection according to the present invention, preferably, a MOS capacitor means which includes an impurity diffusion region which is connected on an extended portion of a channel region of a gate electrode of the MOS transistor in a manner to be adjacent to the gate electrode and contains an identical type of impurity to that of the channel region and another gate electrode which is provided above the impurity diffusion region with a dielectric film or an insulation film interposed may be formed as the inverted signal input unit and an input signal to a source region of the MOS transistor may be inputted into the another gate electrode to input an inverted signal of the input signal into the channel region from the impurity diffusion region.

Further, in the semiconductor device for radiation detection according to the present invention, preferably, the identical type of impurity may be additionally introduced to a position, which is below another gate electrode, of the impurity diffusion region to form a high-concentration impurity diffusion layer the impurity concentration of which is higher than that of the impurity diffusion region.

Further, in the semiconductor device for radiation detection according to the present invention, preferably, an impurity diffusion region one end of which is connected to an extended portion of a channel region, which is provided below a gate electrode of the MOS transistor, and which contains an identical type of impurity to that of the channel region may be provided to be adjacent to the gate electrode while penetrating an interlayer insulation layer in which the gate electrode and the channel region are embedded, a capacitor means to which the other end of the impurity diffusion region is electrically connected and in which both metal films sandwich a dielectric film or an insulation film to form an electrode pair may be provided on the interlayer insulation layer, as an inverted signal input unit and an input signal to be inputted into a source region of the MOS transistor may be inputted also into the capacitor means to input an inverted signal of the input signal into the channel region from the impurity diffusion region.

Further, in the semiconductor device for radiation detection according to the present invention, preferably, a capacitor means in which another metal film is disposed on a metal film, which is connected to an extended portion of a channel region provided under a gate electrode of the MOS transistor, with a dielectric film or an insulation film interposed to form an electrode pair may be provided in a manner to be adjacent to the gate electrode, as an inverted signal input unit and an input signal to be inputted into a source region of the MOS transistor may be inputted also into the capacitor means to input an inverted signal of the input signal into the channel region from the capacitor means.

Further, in the semiconductor device for radiation detection according to the present invention, preferably, the insulator layer formed to have the laminated structure may be at least either one of a part or the whole of the insulator layer, on a channel region side, which is provided between a gate electrode of the MOS transistor and the channel region and a part or the whole of the insulator layer, on the channel region side, which is provided directly under the channel region.

Further, in the semiconductor device for radiation detection according to the present invention, preferably, the film which traps an electron or a hole more easily than the silicon oxide film may be a silicon nitride film.

Further, in the semiconductor device for radiation detection according to the present invention, it is preferable that a voltage range of a voltage of an externally-controlled signal which is applied to a gate electrode of a MOS transistor is either a range from +3.1 V to +12 V or a range from −3.1 V to −12 V.

Further, in the semiconductor device for radiation detection according to the present invention, it is preferable that the radiation detection element and the read circuit which reads a charge from the radiation detection element are integrally formed on a SOI substrate.

Further, in the semiconductor device for radiation detection according to the present invention, it is preferable that the radiation detection element and the read circuit which reads a charge from the radiation detection element are integrally formed on a SOI substrate and radiation incident from either direction between from a front side of the SOI substrate and from a back side of the SOI substrate Can be handled.

According to the above-mentioned configuration, the following advantageous effect of the invention is described.

In the present invention, a semiconductor device for radiation detection which has a silicon-on-insulator (SOI) structure in which a first semiconductor layer or a semiconductor substrate is disposed on a lower surface of an insulator layer and a second semiconductor layer is disposed on an upper surface of the insulator layer, in which a radiation detection element is formed on the first semiconductor layer or the semiconductor substrate, and a read circuit which processes a signal charge, which is detected in the radiation detection element, and includes at least a MOS transistor is formed on the second semiconductor layer, includes an inverted signal input unit which inputs a signal obtained by inverting an input signal inputted into one drive region of the MOS transistor into a channel region of the MOS transistor. In the semiconductor device for radiation detection, a part or a whole of the insulator layer which is disposed to be opposed to the channel region of the MOS transistor is formed to have a laminated structure of a silicon oxide film or a film which traps and holds an electron or a hole equivalently to the silicon oxide film and a film which traps an electron or a hole more easily than the silicon oxide film.

Due to this inverted signal input unit, variation in threshold voltages in a device operation can be reduced.

Advantageous Effects of Invention

Thus, according to the present invention, an inverted signal input unit inputs a signal obtained by inverting an input signal inputted into one drive region of a MOS transistor into a channel region, so that variation in threshold voltages in a device operation can be reduced.

Figure 1:
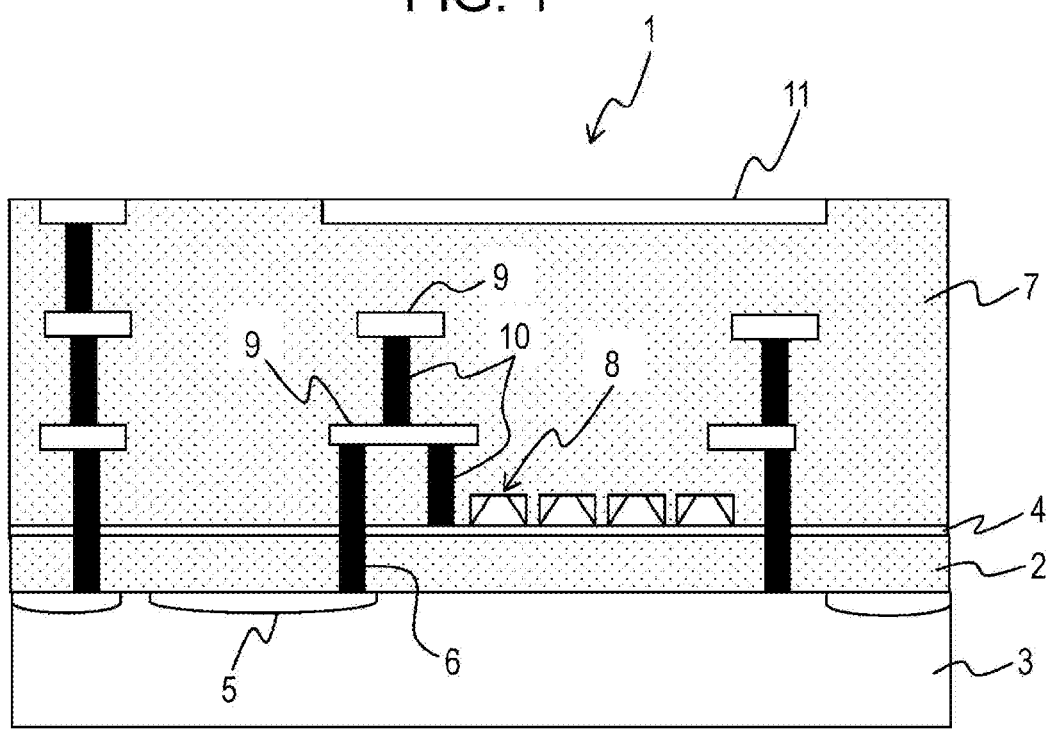
FIG. 1 is a sectional view illustrating an example of a semiconductor device for radiation detection which has the SOI structure according to a first embodiment of the present invention.

REFERENCE SIGNS LIST 1, 1A to 1F semiconductor device for radiation detection
2 insulator layer
3 thick single-crystal silicon layer (semiconductor layer or semiconductor substrate)
4 thin single-crystal silicon layer
41, 41A to 41E channel region
42 high-concentration impurity diffusion layer
43 source region
44 drain region
45 ferroelectric film
45a input terminal
5 radiation detection element
51 photodiode
51a intrinsic semiconductor substrate
51b P-type semiconductor layer
51c N-type semiconductor layer
51d surface electrode
51e back electrode
52 avalanche photodiode
52a semiconductor substrate
52b n-region
52c P-type region
52d p-region
52e protection film
52f light shielding metal
52g P-side electrode
52h contact layer
52i N-side electrode
6, 10, 44a, 81a, 82b, 43b contact electrode
7, 71 interlayer insulation layer
8 read circuit
80 CMOS circuit
80a P-channel MOS transistor
80b N-channel MOS transistor
81, 81A to 81E gate electrode for a MOS transistor 82, 82C gate electrode for a MOS capacitor (another gate electrode)
83, 83C silicon nitride film
84 silicon oxide film
85, 85C first poly silicon film serving as a MOS capacitor means
86, 86C interlayer insulation film
87, 87C dielectric film
88, 88C second poly silicon film serving as a MOS capacitor means (another gate electrode)
88a input terminal
89C high-concentration impurity diffusion layer
90 poly silicon film (electrode film)
90a input terminal
91 contact electrode
92 capacitor means
93 metal electrode on a lower side (metal film)
94 dielectric film (insulation film)
95 metal electrode on an upper side (metal film)
95a input terminal
9 metal wiring
11 light shielding metal

DESCRIPTION OF EMBODIMENTS

A semiconductor device for radiation detection according to embodiments 1 to 7 of the present invention will be described below in detail with reference to the accompanying drawings. Here, thicknesses, lengths, and the like of respective constituent members in respective drawings are not limited to the configurations illustrated in the drawings in the light of drawing preparation. Further, the numbers of wirings, contact electrodes, and the like do not have to be accorded with an actual device but those elements are shown in those numbers for the sake of convenience of illustration and description and are not limited to the illustrated configurations. Furthermore, the semiconductor device for radiation detection according to the embodiments 1 to 7 can be subjected to various alterations within the scope described in Claims. That is, embodiments which are obtained by further combining technical means which is arbitrarily altered within the scope of Claims of the present application are also included in the technical scope of the present invention.

First Embodiment

FIG. 1 is a sectional view illustrating an example of a semiconductor device 1 for radiation detection, according to the first embodiment of the present invention, which has the SOI structure.

In FIG. 1, the semiconductor device 1 for radiation detection, according to the first embodiment, which has the SOI structure includes an insulator layer 2, a single-crystal silicon layer 3 (or a silicon substrate) which serves as a first semiconductor layer (or a semiconductor substrate) and is disposed on a lower surface of the insulator layer 2, and a single-crystal silicon layer 4 which serves as a second semiconductor layer and is disposed on an upper surface of the insulator layer 2, as the SOI structure.

In the thick single-crystal silicon layer 3 of the SOI structure, a radiation detection element 5 such as a photodiode and an avalanche photodiode is formed. On the thin single-crystal silicon layer 4 of the SOI structure, a read circuit 8 which reads a signal charge which is detected in the radiation detection element 5, with a contact electrode 6, through the thin single-crystal silicon layer 4 and an interlayer insulation layer 7 which is provided on the single-crystal silicon layer 4 and performs processing of amplification and the like is formed. The contact electrode 6 is formed in the insulator layer 2 and is made of tungsten W, for example, which has a superior embedding property.

The read circuit 8 is a circuit which is composed of active elements such as a MOS transistor and passive elements such as a resistor and a capacitor and reads a signal charge detected in the radiation detection element 5 and performs processing of amplification and the like. Further, the read circuit 8 includes a CMOS circuit which inverts analog input signals received from the radiation detection element 5 to respective predetermined voltage values, when reading the signals, in accordance with input signal values of the analog input signals and is composed of a series circuit of a P-channel MOS transistor and an N-channel MOS transistor.

This SOI structure is a structure in which the insulator layer 2 which is composed of a silicon oxide film or the like is sandwiched by single-crystal silicon wafers from the top and the bottom and the physical structure is made as the thick single-crystal silicon layer 3, the insulator layer 2, and the thin single-crystal silicon layer 4 provided from the bottom.

Here, in the thin single-crystal silicon layer 4 provided on the upper surface of the insulator layer 2 and the interlayer insulation layer 7 provided on the single-crystal silicon layer 4, a semiconductor device which constitutes the read circuit 8, a metal wiring 9 which connects respective portions of the semiconductor device and is made of aluminum Al or the like, and a contact electrode 10 which is made of tungsten W or the like which has a superior embedding property are formed. Further, the radiation detection element 5 is formed in the single-crystal silicon layer 3 provided on the lower surface of the insulator layer 2, but in general, the single-crystal silicon layer 3 provided on the lower surface of the insulator layer 2 is merely a physical structure (support substrate). The radiation detection element 5 which is composed of a photodiode, an avalanche photodiode, or the like is formed in the thick single-crystal silicon layer 3 provided on the lower surface of the insulator layer 2 to form a depletion layer in the single-crystal silicon layer 3 provided on the lower side, a via hole which is composed of a metal wiring (contact electrode 6) is formed in the insulator layer 2, which is a silicon oxide film layer or the like and is provided in the center of the SOI structure, by using a semiconductor process technique, and the semiconductor circuit which is constructed on the thin single-crystal silicon layer 4 provided on the upper surface of the insulator layer 2 and the radiation detection element 5 formed in the single-crystal silicon layer 3 provided on the lower side are connected with each other via the contact electrode 6, the metal wiring 9, and the contact electrode 10. Thus, integral formation of the radiation detection element 5 and the read circuit 8 of the radiation detection element 5 on one substrate is realized.

The present method has the advantage that large bump bonding for connecting the radiation detection element 5 and the read circuit 8 is not required because the radiation detection element 5 and the read circuit 8 are integrally formed with the insulator layer 2 interposed therebetween. Thus, terminal connection which is electrically and mechanically large in size such as bump bonding is not required for connection between the radiation detection element 5 (a sensor) and the read circuit 8, so that a pixel size of a smaller area can be realized. Thus, a circuit area can be reduced, so that a CMOS circuit which has a complicated signal processing function can be mounted on each pixel. A CMOS circuit can be used for the read circuit 8.

Further, parasitic capacitance by a bump electrode is eliminated because bump bonding is not required. Accordingly, it can be expected that the read circuit 8 reads a signal from the radiation detection element 5 in higher speed and in lower power consumption. Furthermore, cost reduction associated with integration of the radiation detection element 5 and the read circuit 8 (one chipping) instead of separate chips may be attained.

In addition to these, the insulator layer 2 which is a silicon oxide film provided in the center of the SOI structure exists between adjacent elements which are the radiation detection element 5 and the read circuit 8, so that a separation property between upper and lower elements is improved, latch-up between the elements is not required and further, a distance between the elements which are the radiation detection element 5 and the read circuit 8 can be reduced.

In terms of the radiation detection element 5 which is formed in the single-crystal silicon layer 3 provided under the insulator layer 2, in a case where radiation is incident from a back side of the SOI substrate, for example, the radiation detection element 5 may directly perform photoelectrical conversion from radiation into an electrical signal by a photodiode. In a case where radiation is incident from a front side of the SOI substrate, a scintillator which is made of composite materials by which radiation can be converted into light (visible light, ultraviolet light, and infrared light) may be connected on a front side of a chip, for example, and the radiation detection element 5 may indirectly perform photoelectric conversion from light into an electrical signal by a photodiode or an avalanche photodiode. In this case, a light shielding metal 11 may be formed on a front side of the interlayer insulation layer 7 directly above a portion in which the read circuit 8 is embedded so as to suppress incidence of unwanted light on the read circuit 8 from the outside. Further, it is obvious that a scintillator may be connected on a back side of the chip so as to indirectly perform photoelectric conversion from light into an electrical signal.

The single unit configuration of a photodiode or an avalanche photodiode of the radiation detection element 5 illustrated in FIG. 1 is now described.

Figure 2:
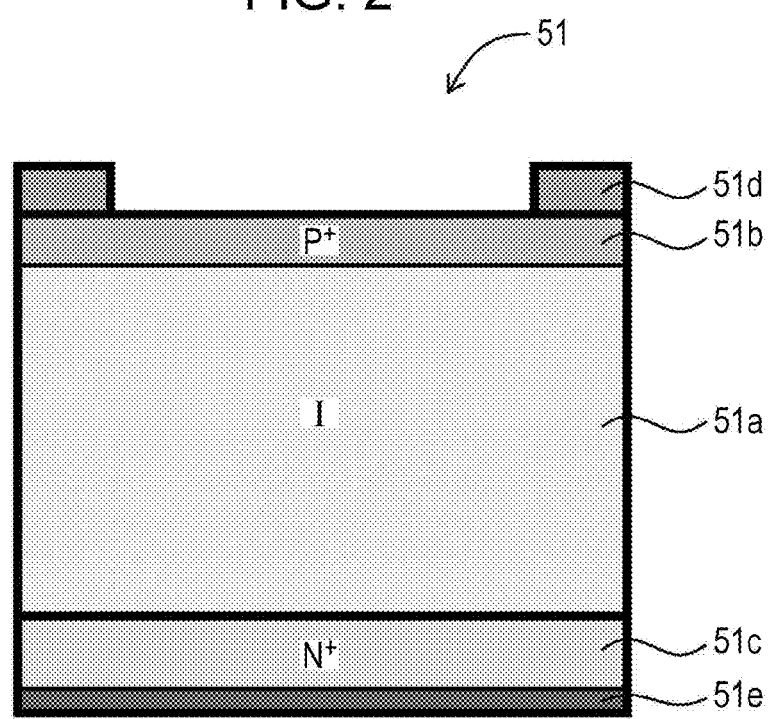
FIG. 2 is a longitudinal sectional view schematically illustrating an example of the configurations of chief portions of a photodiode as a single unit case of the radiation detection element illustrated in FIG. 1.

FIG. 2 is a longitudinal sectional view schematically illustrating an example of the configurations of chief portions of a photodiode as a single unit case of the radiation detection element 5 illustrated in FIG. 1.

In FIG. 2, a photodiode 51 has a PIN diode structure and a P-type semiconductor layer 51*b* and an N-type semiconductor layer 51*c* are disposed respectively on upper and lower surfaces of an intrinsic semiconductor substrate 51*a*. A surface electrode 51*d* is disposed in a state in which a top of the central portion of the P-type semiconductor layer 51*b* is open and a back electrode 51*e* is disposed on the N-type semiconductor layer 51*c*.

The top of the central portion of the P-type semiconductor layer 51*b* is open so that light is incident and electrodes are not formed on a light-receiving surface.

Figure 3:
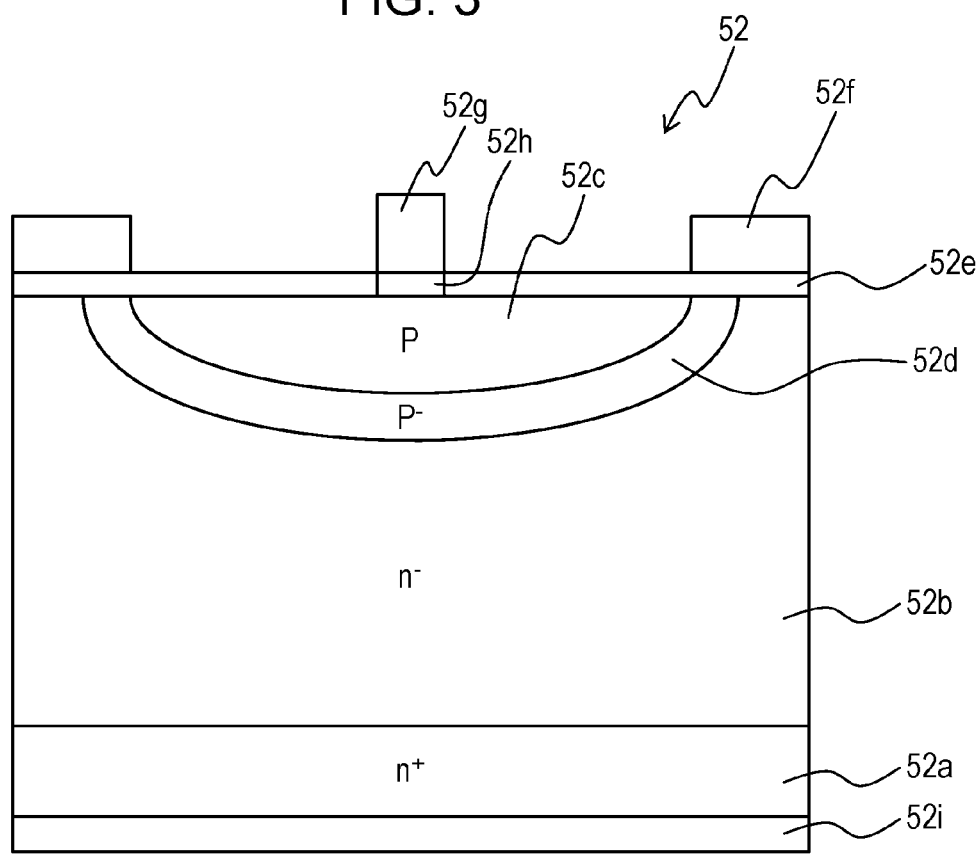
FIG. 3 is a longitudinal sectional view schematically illustrating an example of the configurations of chief portions of an avalanche photodiode as another single unit case of the radiation detection element illustrated in FIG. 1.

FIG. 3 is a longitudinal sectional view schematically illustrating an example of the configurations of chief portions of an avalanche photodiode as another single unit case of the radiation detection element 5 illustrated in FIG. 1.

In FIG. 3, an n-region 52*b* is provided on a surface of a semiconductor substrate 52*a*, a P-type region 52*c* is provided within a predetermined range of a central portion in the n-region 52*b* from a surface side of the n-region 52*b*, and a p-region 52*d* is further provided to surround and cover the P-type region 52*c*, in an avalanche photodiode 52. On surface sides of the n-region 52*b*, the P-type region 52*c*, and the p-region 52*d*, a protection film 52*e* is formed. A light shielding metal 52*f* is formed on the protection film 52*e* in a manner to open a top of the P-type region 52*c*. A P-side electrode 52*g* is provided to be connected with the central portion of the P-type region 52*c* via a contact layer 52*h* and an N-side electrode 52*i* is provided on a back side of the semiconductor substrate 52*a*.

Figure 4:
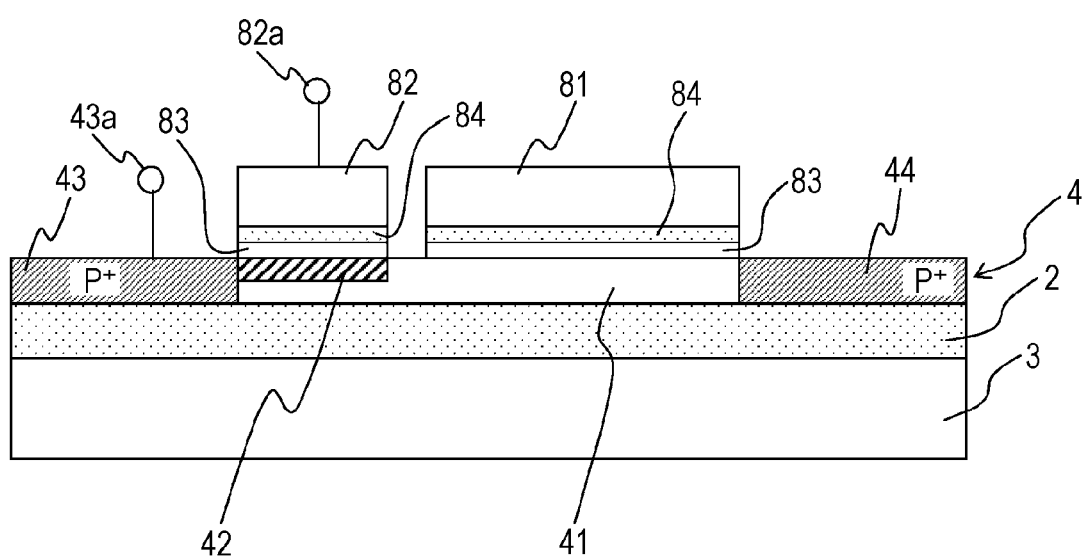
FIG. 4 is a sectional view illustrating a MOS transistor element which is formed in the single-crystal silicon layer provided on the insulator layer and constitutes the read circuit of the semiconductor device for radiation detection illustrated in FIG. 1.
Figure 5:
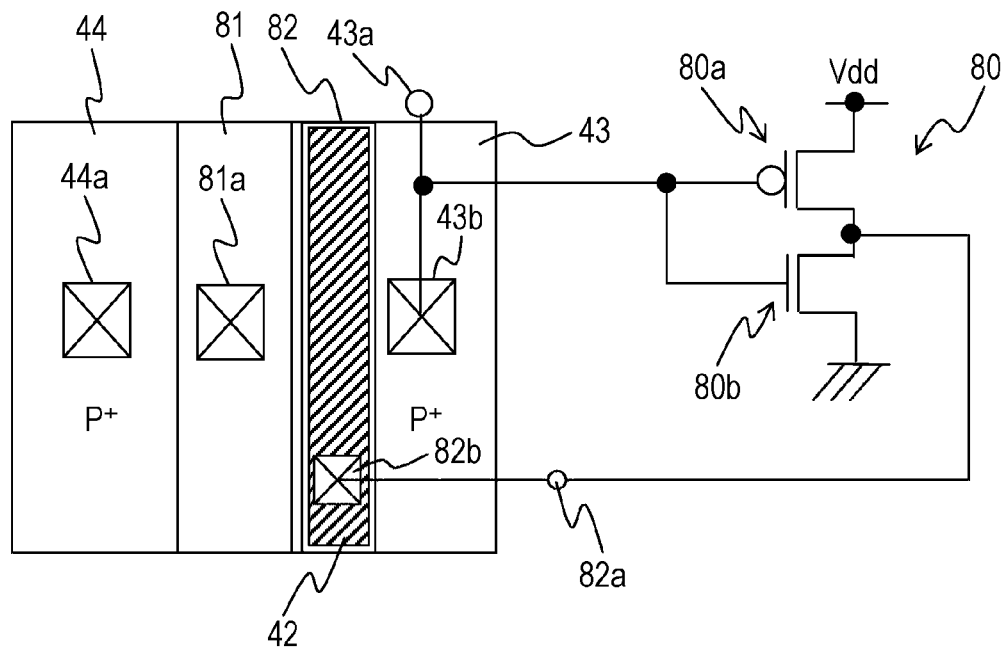
FIG. 5 is a plan view illustrating an example of the layout configuration of FIG. 4.

FIG. 4 is a sectional view illustrating a MOS transistor element which is formed in the single-crystal silicon layer 4 provided on the insulator layer 2 and constitutes the read circuit 8 of the semiconductor device 1 for radiation detection illustrated in FIG. 1. FIG. 5 is a plan view illustrating an example of the layout configuration of FIG. 4. In FIG. 5, from the left side, 44*a* denotes a contact electrode which is connected with a drain region 44 and derived, 81*a* denotes a contact electrode which is connected with a gate electrode 81 for a MOS transistor and derived, 82*b* denotes a contact electrode which is connected with a gate electrode 82 and derived, and 43*b* denotes a contact electrode which is connected with a source region 43 and derived. Though a high-concentration impurity diffusion layer 42 is seen through in FIG. 5, another gate electrode 82 is provided on the high-concentration impurity diffusion layer 42.

In FIG. 4 and FIG. 5, the SOI structure is formed such that the insulator layer 2 which is composed of a silicon oxide film or the like is sandwiched by the single-crystal silicon layer 3 and the single-crystal silicon layer 4 from the upper and lower sides and the physical structure thereof is made by providing the single-crystal silicon layer 4 which is a thin silicon layer, the insulator layer 2, and the single-crystal silicon layer 3 which is a thick silicon layer from the top. In general, a circuit such as the read circuit 8 is formed on the single-crystal silicon layer 4 provided on the insulator layer 2 and the single-crystal silicon layer 3 provided under the insulator layer 2 is merely a physical structure (a support substrate). The radiation detection element 5 such as the photodiode 51 and the avalanche photodiode 52 which are mentioned above is formed in the single-crystal silicon layer 3 which is the support substrate portion.

A predetermined voltage is applied to this radiation detection element 5 so as to form a depletion layer in the single-crystal silicon layer 3 and detect radiation. A via hole (the contact electrode 6) which is composed of a metal wiring is formed in the insulator layer 2, which is a silicon oxide film layer provided in the center of the SOI structure, by using a semiconductor process technique and thus, integrated element formation between the read circuit 8 as the semiconductor circuit and the radiation detection element 5 that detects radiation can be realized on a single substrate. The read circuit 8 is constructed on the single-crystal silicon layer 4 provided on the insulator layer 2 and reads a signal charge which is obtained by converting detected radiation into a charge as a signal voltage.

Though the example of a P-channel transistor is shown as one example of a pattern layout of FIG. 4 and FIG. 5, an N-channel transistor also has the similar configuration. Here, the radiation detection element 5 which is constructed in the single-crystal silicon layer 3 provided under the insulator layer 2 is not limited to a photodiode or an avalanche photodiode. The SOI substrate has a structure in which the insulator layer 2 which is a silicon oxide film layer or the like provided in the center of the SOI structure is sandwiched by the single-crystal silicon layers 4 and 3 from the top and the bottom respectively. In order to construct a MOS transistor, the single-crystal silicon layer 4 provided on the insulator layer 2 includes a channel region 41 which is formed by introducing boron, phosphorus, arsenic, and the like, for example, as impurity ions. Another gate electrode 82 is formed alongside of the gate electrode 81 of the MOS transistor which is formed on the channel region 41 to be adjacent to the gate electrode 81 with a predetermined gap.

The high-concentration impurity diffusion layer 42 for charge fixing which is formed by additionally introducing impurities to increase the impurity concentration is provided on the upper side of the thin single-crystal silicon layer 4 provided on the insulator layer 2 directly below the gate electrode 82 (another gate electrode) for a MOS capacitor. That is, the high-concentration impurity diffusion layer 42 which is formed by additionally introducing impurities to increase the impurity concentration is formed in a portion, which is on another gate electrode side, of the channel region 41 which is opposed to another gate electrode 82 (the gate electrode 82 for a MOS capacitor). In this example, the thickness of the high-concentration impurity diffusion layer 42 is smaller than the thickness of the channel region 41 and the high-concentration impurity diffusion layer 42 is formed on an upper side of the channel region 41.

On the other hand, an input terminal 43a which is connected with the source region 43 of the MOS transistor is connected with the contact electrode 6 which is connected with the radiation detection element 5. If an input signal which is inputted into this input terminal 43a is inputted into the source region 43 of the MOS transistor, a potential of the channel region 41 fluctuates due to capacitance coupling of the source region 43 and the channel region 41. For example, a channel potential of the channel region 41 is increased with respect to an input signal of the high level inputted into the source region 43 and a channel potential of the channel region 41 is decreased with respect to an input signal of the low level inputted into the source region 43. Consequently, a threshold value of the MOS transistor is varied and the response characteristic of a circuit varies in accordance with an input potential level.

This point is described below by using the following formulas.

In general, in a MOS transistor which is subjected to a back gate effect, the following formulas are obtained. A threshold voltage $V_{TH}$ is varied due to fluctuation of a gate voltage $V_G$ (a potential of the channel region 41) and an on resistance $R_{ON}$ is varied.

$$V_{TH} = V_{T0} - BK \times (V_G)^{1/2}$$

$$R_{ON} = 1/uC(V_G - V_{TH}) \cdot L/W$$

$$BK = (2 \in Si \cdot E \cdot q \cdot Nsub)^{1/2}/C$$

Here, $V_G$: gate voltage, $V_{T0}$: threshold voltage obtained when substrate bias is not applied, C: electrostatic capacitance per unit area of a gate electrode, u: mobility of a surface of a semiconductor Si, q: unit charge amount, Nsub: substrate concentration, BK: substrate effect coefficient, $\in$Si: relative dielectric constant of Si, $\in$: dielectric constant in a vacuum, q: unit charge amount, Nsub: substrate concentration, L: gate length of the MOS transistor, and W: gate width of a MOS transistor.

Therefore, if a signal which is obtained by inverting an input signal is inputted into the gate electrode 82 for a MOS capacitor which is adjacent to the gate electrode 81 for a MOS transistor, fluctuation of the channel potential of the channel region 41 can be suppressed.

In this first embodiment, an inverted signal input unit which inputs a signal obtained by inverting an input signal inputted into the source region 43 of the MOS transistor into the channel region 41 is provided. In this example, the inverted signal input unit includes another gate electrode 82, which is formed on an extended portion, which is extended toward the left side, of the channel region 41, which is provided directly under the gate electrode 81, in a manner to be adjacent to the gate electrode 81 of the MOS transistor and a CMOS circuit 80 which inverts an input signal inputted into the source region 43 of the MOS transistor into either predetermined voltage between a power supply voltage and a ground voltage in accordance with an input value of the input signal. The inverted signal input unit inputs a signal which is inverted in the CMOS circuit 80 to the gate electrode 82 via an input terminal 82a.

In the semiconductor device 1 for radiation detection according to this first embodiment, the input terminal 43a of the source region 43 is connected with a gate input end of the CMOS circuit 80 and an output end of the CMOS circuit 80 is connected with the input terminal 82a of the gate electrode 82 for a MOS capacitor so that a signal obtained by inverting an input signal inputted into the source region 43 of the MOS transistor from the input terminal 43a is inputted into the input terminal 82a of the gate electrode 82 for a MOS capacitor.

Further, the high-concentration impurity diffusion layer 42 having higher concentration is formed directly under the gate electrode 82 for a MOS capacitor, so that a surface state of the single-crystal silicon layer 4 on which the MOS capacitor is formed can be constantly maintained in a fixed state of an inverted potential.

Accordingly, a fixed potential obtained by inverting a potential with respect to an input signal can be provided to the channel region 41 of the MOS transistor and thus, an operation of a circuit constituted by the MOS transistor can be further stabilized.

Thus, the above-mentioned inverted signal input unit which is capable of preventing fluctuation of a potential of the channel region 41, when a source potential or a potential of an input signal inputted into the source region 43 is changed, and stabilizes an operation of the MOS transistor can be obtained. By the above-mentioned inverted signal input unit, variation in threshold voltages in a device operation can be reduced.

The configuration of this first embodiment provided with a gate electrode for MOS capacitor produces the following advantageous effect as well.

In terms of the on resistance $R_{ON}$ of the MOS transistor, when a channel width (a gate width W) is designed to be long, the on resistance $R_{ON}$ can be reduced.

In the configuration of this first embodiment, though the gate length L is elongated by adding the gate electrode 82 for a MOS capacitor, the channel width (the gate width W) of the gate electrode 81 of the MOS transistor is substantively more elongated. Therefore, the on resistance $R_{ON}$ can be reduced. Accordingly, this device configuration has an advantage on reduction of the on resistance $R_{ON}$.

In the SOI substrate, variation in threshold voltages caused by variation of the SOI layer is generated. In a case where a large number of analog circuit blocks which are sensitive to threshold value fluctuation, such as the read circuit 8 of the semiconductor device 1 for radiation detection according to this first embodiment, are mounted for every pixel, an influence of variation in threshold voltages in each analog circuit block is not ignorable and variation in threshold voltages is required to be adjusted.

In this first embodiment, insulator layers directly under the gate electrode 81 for a MOS transistor and the gate electrode 82 for a MOS capacitor, which are opposed to the channel region 41 of the MOS transistor, are respectively formed as a laminated structure which is composed of a silicon nitride film 83 and a silicon oxide film 84 in the semiconductor device 1 for radiation detection according to this first embodiment, so as to realize correction and control of threshold value variation caused by the SOI film thickness with the simple configuration without requiring an additional circuit which exerts influence on a pixel size, in addition to with the above-mentioned configuration which suppresses threshold voltage fluctuation caused by an input voltage.

This laminated structure is the polysilicon-oxide-nitride-oxide-silicon (SONOS) structure or the metal-nitride-oxide-semiconductor (MONOS) structure. Metal in the MONOS structure is a concept representing the whole gate electrodes in a MOS transistor and a polysilicon electrode in the SONGS structure also belongs to this category.

Instead of the silicon oxide film 84 between laminated films of the silicon nitride film 83 and the silicon oxide film 84 which constitute the insulator layer provided directly under the gate electrodes 81 and 82 which are opposed to the channel region 41 of the MOS transistor, another film which is equivalent to the silicon oxide film 84 and easily traps carriers may be used. Further, the silicon nitride film 83 is employed as a film which traps carriers more easily than the silicon oxide film 84, but the film is not limited to this. Another film which traps carriers more easily than the silicon oxide film 84 may be employed and accordingly, a carrier trap amount can be controlled as well.

In short, the insulator layer which is disposed to be opposed to the channel region 41 in the MOS transistor of the read circuit 8 which includes the CMOS circuit 80 which is composed of a series circuit of a P-channel MOS transistor 80*a* and an N-channel MOS transistor 80*b* is formed to have a laminated structure composed of the silicon oxide film 84 or a film which traps and holds electrons or holes equivalently to the silicon oxide film 84 and a film which traps electrons or holes more easily than the silicon oxide film 84 (the silicon nitride film 83 in this example).

Due to the employment of such insulation film having a two-layer structure, even if a defect is generated in the silicon oxide film 84, only charges which are trapped in the immediate vicinity of the defect are discharged. Thus, an influence associated with a defect of the oxide film can be reduced and long-term credibility can be secured. Accordingly, this structure is more preferable for the semiconductor device 1 for radiation detection which is required to have high and long-term credibility. Accumulated charges apply an electric field to the channel region 41 of the MOS transistor which is formed in the single-crystal silicon layer 4 above the charges so as to be able to vary a threshold value.

The following method, for example, can be used for charge accumulation. A voltage is applied to at least a portion between the channel region 41 of the single-crystal silicon layer 4 on the upper side and a substrate region to apply leak current such as Fowler-Nordheim (FN) current. Electrons or holes which are carriers of this, current is captured by a defect existing in the silicon nitride film 83 or in an interface of the silicon nitride film 83 and the silicon oxide film 84 and accordingly, a lower surface portion of the channel region 41 is charged. An electric field is applied to the MOS transistor, which is formed in the single-crystal silicon layer 4 provided on the insulator layer 2, by accumulated charges and a threshold value can be changed.

The varying amount of a threshold value of a MOS transistor is proportional to the amount of accumulated charges, so that a threshold value can be controlled by arbitrarily adjusting the amount of current which passes through the silicon nitride film 83. Further, as a current source, an electrode may be separately provided in the channel region 41 which is formed in the thin single-crystal silicon layer 4 provided on the upper side and a source electrode or a drain electrode may be used. In a case of the former, both of positive and negative voltages can be applied, so that a threshold value can be corrected in both ways. In a case of the latter, it is necessary to apply a voltage of the forward direction of PN junction, so that a negative voltage is applied in an N-channel MOS transistor and a positive voltage is applied in a P-channel MOS transistor so as to enable change of a threshold value.

In this method, correction of a threshold value is limited to either one way of increase and decrease and it is necessary to preliminarily set a threshold value rather low (slightly lower) or rather high (slightly higher) in accordance with a way in which a threshold value can be corrected. A threshold value is preliminarily set rather low or rather high and is increased or decreased by a predetermined amount so that variation in threshold values is absorbed to be suppressed or eliminated. Thus, threshold values can be stabilized. This is illustrated in FIG. 13 and FIG. 14.

Figure 13:
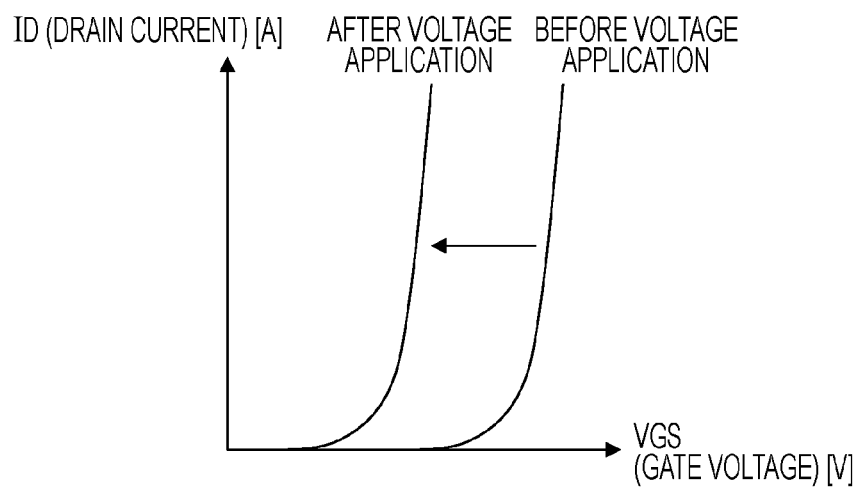
FIG. 13 is a drawing illustrating change of a threshold voltage characteristic (in a case where a gate voltage is decreased) of a MOS transistor of a case where threshold value control is performed in the semiconductor device for radiation detection according to the present invention.
Figure 14:
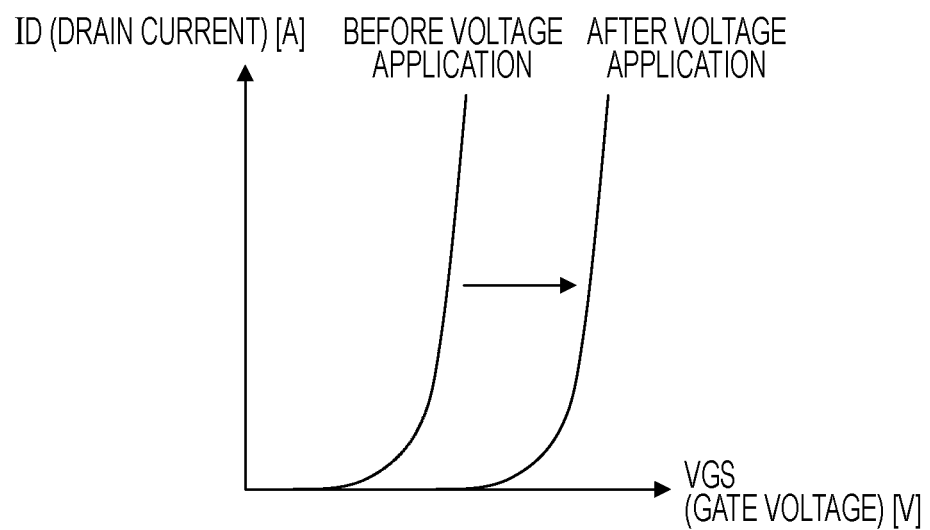
FIG. 14 is a drawing illustrating change of a threshold voltage characteristic (in a case where a gate voltage is increased) of a MOS transistor of a case where threshold value control is performed in the semiconductor device for radiation detection according to the present invention.

FIG. 13 and FIG. 14 are drawings illustrating change of a threshold voltage characteristic of a MOS transistor of a case where threshold value control is performed in the semiconductor device 1 for radiation detection. FIG. 13 illustrates gate voltage dependency of drain current in a case where a gate voltage is decreased. FIG. 14 illustrates gate voltage dependency of drain current in a case where a gate voltage is increased.

Further, electrons are required to have energy of at least approximately 3.1 eV so that carriers cross over a barrier in the silicon oxide film 84 which is opposed to the channel region 41 of the MOS transistor. Further, in a case where the relatively large film thickness such as 10 nm, for example, is adopted as the film thickness of a gate insulation film employing the present structure in the light of credibility for control of defect concentration, stress-induced leakage, maintenance of high-temperature shelf resistance, and the like, a voltage of approximately 12 V is required for applying an intense electric field to the gate insulation film to move electrons in and out. Accordingly, a voltage range of an externally-applied signal in the semiconductor device 1 for radiation detection according to this first embodiment is preferably in a voltage range from ±3 V to ±12 V. That is, a voltage range of an externally-controlled signal which is applied to the gate electrodes 81 and 82 of the MOS transistor may be either a voltage range from +3.1 V to +12 V or a voltage range from −3.1 V to −12 V.

As mentioned above, according to this first embodiment, the insulation layer which is disposed to be opposed to the channel region 41 of the MOS transistor is formed to have the laminated structure composed of the silicon nitride film 83 and the silicon oxide film 84. The inverted signal input unit which inputs a signal obtained by inverting an input signal inputted into the source region 43 of the MOS transistor into the channel region 41 is provided. The inverted signal input unit includes another gate electrode 82 which is formed on an extended portion of the channel region 41 below the gate electrode 81 in a manner to be adjacent to the gate electrode 81 of the MOS transistor and the CMOS circuit 80 which inverts an input signal inputted into the source region 43 of the MOS transistor in accordance with an input value of the input signal, and inputs a signal obtained through inversion in the CMOS circuit 80 into another gate electrode 82.

Thus, the semiconductor device 1 for radiation detection which is capable of easily reducing variation in threshold voltages and, in addition, capable of correcting and controlling threshold value variation with the simple configuration, without requiring an additional circuit which exerts influence on a pixel size, so as to obtain a highly-precise circuit characteristic can be realized. Thus, variation in threshold voltages in a device operation can be reduced.

Though it has not been especially described in this first embodiment, use of a method of charge injection other than that described above does not cause any functional problems in the semiconductor device 1 for radiation detection according to this first embodiment. Further, as for irradiation direction of radiation such as X rays, radiation may be made incident from either the front side of the SOI substrate or the back side of the SOI substrate depending on the structure and the characteristic of the radiation detection element 5 to be used.

Further, in this first embodiment, such case has been described that the insulator layer which is disposed to be opposed to the channel region 41 of the MOS transistor in the read circuit 8 which includes the CMOS circuit 80 is formed to have the laminated structure composed of the silicon oxide film 84 or a film which traps and holds electrons or holes equivalently to the silicon oxide film 84 and a film which traps electrons or holes more easily than the silicon oxide film 84 (the silicon nitride film 83 in this example). However, the configuration is not limited to this. A part or the whole of the insulator layer which is disposed to be opposed to the channel region 41 of the MOS transistor in the read circuit 8 which includes the CMOS circuit 80 may be formed to have the laminated structure composed of the silicon oxide film 84 or a film which traps and holds electrons or holes equivalently to the silicon oxide film 84 and a film which traps electrons or holes more easily than the silicon oxide film 84.

This laminated structure of the silicon nitride film 83 and the silicon oxide film 84 may be employed for an insulation film of the insulator layer 2 which is sandwiched by the single-crystal silicon layer 4 on the upper side and the single-crystal silicon layer 3 on the lower side.

Accordingly, the insulator layer having the laminated structure composed of the silicon oxide film 84 or a film which traps and holds electrons or holes equivalently to the silicon oxide film 84 and a film which traps electrons or holes more easily than the silicon oxide film 84 is at least either insulator layer between a part, on the channel region 41 side, or the whole of an insulator layer disposed between the gate electrodes 81 and 82 of the MOS transistor and the channel region 41 and a part, on the channel region 41 side, or the whole of the insulator layer 2 disposed directly under the channel region 41.

A part, on the channel region 41 side, or the whole of an insulator layer disposed between the gate electrodes 81 and 82 and the channel region 41 may be the whole film thickness or a part film thickness in the whole film thickness of the insulator layer disposed between the gate electrodes 81 and 82 and the channel region 41 or may be the whole area or a part of the whole area of the insulator layer such as a half (½), ¼, and ¾. Similarly, a part, on the channel region 41 side, or the whole of the insulator layer 2 which is provided directly under the channel region 41 may be the whole film thickness or a part film thickness of the whole film thickness or may be the whole area or a part of the whole area such as a half (½), ¼, and ¾.

Second Embodiment

In this second embodiment, with the above-described first embodiment, such configuration will be described that a substrate bias potential is self-generated from a source potential via a diffusion resistance layer 46 in a case where the source potential is higher than the substrate bias potential and a source potential is self-generated from a substrate bias potential via the diffusion resistance layer 46 in a case where the source potential is lower than the substrate bias potential.

Figure 6:
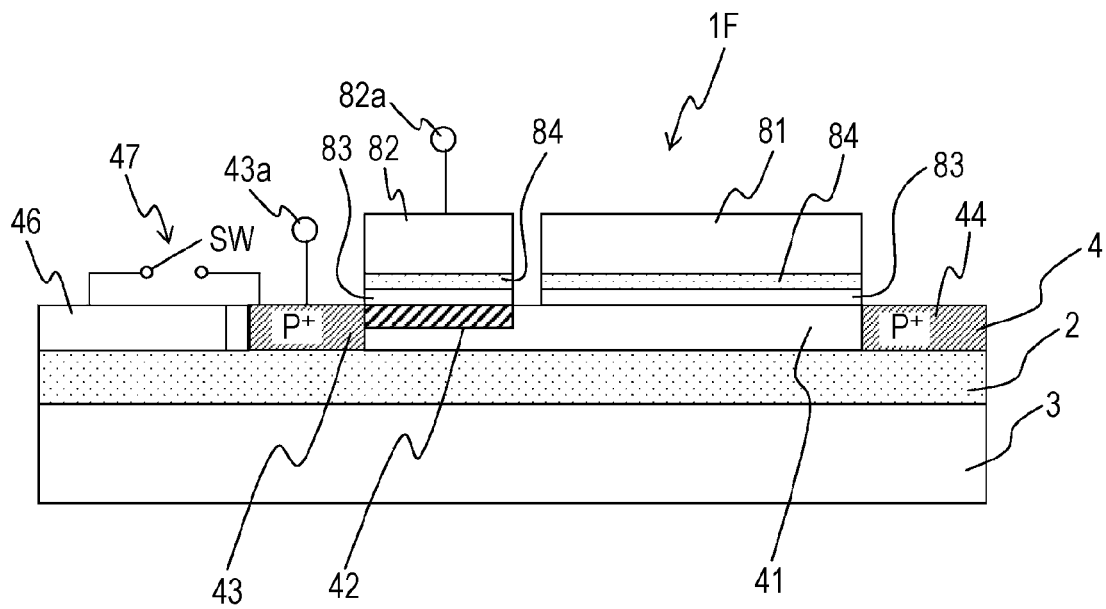
FIG. 6 is a sectional view illustrating a MOS transistor element which is formed on a single-crystal silicon layer, which is provided on an insulator layer, and constitutes a read circuit of a semiconductor device for radiation detection which has the SOI structure and the peripheral portion of the MOS transistor element, according to a second embodiment of the present invention.
Figure 7:
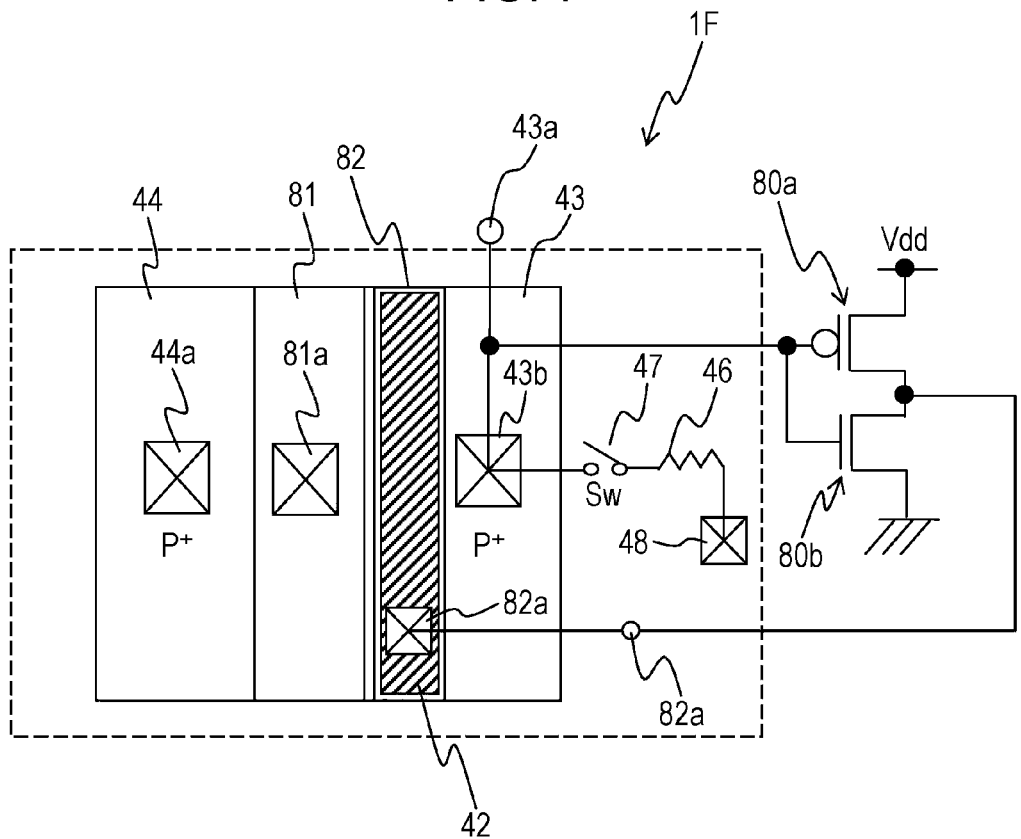
FIG. 7 is a plan view illustrating an example of the layout configuration of FIG. 6.

FIG. 6 is a sectional view illustrating a MOS transistor element which is formed on the single-crystal silicon layer 4, which is provided on the insulator layer 2, and constitutes the read circuit 8 of a semiconductor device 1F for radiation detection which has the SOI structure and the peripheral portion of the MOS transistor element, according to the second embodiment of the present invention. FIG. 7 is a plan view illustrating an example of the layout configuration of FIG. 6. Here, in FIG. 6 and FIG. 7, constituent members which exhibit function effects identical to those of constituent members of FIG. 4 and FIG. 5 will be given the identical reference characters and descriptions thereof will be omitted.

In FIG. 6 and FIG. 7, the semiconductor device 1F for radiation detection according to this second embodiment is different from the case of the above-described first embodiment in that the input terminal 43a which is connected from the radiation detection element 5 via the contact electrode 6 is connected to a contact electrode 43b which is connected with the source region 43 and derived and a back gate electrode 48 of the single-crystal silicon layer 4 is connected to the contact electrode 43b of the source region 43 via the diffusion resistance layer 46 and a switch means 47. In short, the back gate electrode 48 of the single-crystal silicon layer 4 which is the second semiconductor layer is connected to the source region 43 via the switch 47 serving as a switch means from the diffusion resistance layer 46.

Among analog circuits, there are some circuits in which a high and low relation between a source potential of the source region 43 and a drain potential of the drain region 44 is not determined when power is applied. Therefore, such phenomenon arises that in a case where a source potential VS transits from the high level (H) to the low level (L) while a gate voltage VG is maintained at the high level (H), a potential of the channel region 41 which is in a floating state falls due to coupling capacitance which exists between the channel region 41 and the source region 43. Consequently, transition time of an inverted signal of a means for fixing a channel potential described in the first embodiment is prolonged, so that such problem that prevention of threshold value fluctuation is delayed arises.

In order to shorten this transition time, the switch 47 serving as a switch means is turned on in the beginning of start-up of a circuit power supply and the diffusion resistance layer 46 is interposed between the source electrode (the source region 43) of the MOS transistor and the back gate electrode 48. In a layout of the back gate, a large number of MOS transistors (FET) share a single piece of back gate electrode 48 exactly in the same way as a well in a bulk CMOS. A substrate bias is imparted to the back gate electrode 48, so that a source potential of the MOS transistor does not rapidly transit by turn-on of the switch 47.

Thus, the diffusion resistance layer 46 is interposed between the source electrode (the source region 43) and the back gate electrode 48. Therefore, an operation is performed such that a potential of a substrate bias (the back gate electrode 48) is self-generated via the diffusion resistance layer 46 in a MOS transistor in which a source potential is higher than the substrate bias and a source potential is self-generated from the substrate bias in a MOS transistor in which the source potential is lower than the substrate bias in the beginning of the start-up of the power supply. Accordingly, variation in threshold voltages in a device operation can be suppressed by combination with the means for fixing a potential of the channel region 41.

Third Embodiment

In the above-described first embodiment, the case where the insulator layer which is disposed to be opposed to the channel region 41 in the MOS transistor is formed to have the laminated structure composed of the silicon nitride film 83 and the silicon oxide film 84 is described. In the above-described second embodiment, with the laminated structure of the above-described first embodiment or instead of this laminated structure, the configuration in which the back gate electrode 48 of the single-crystal silicon layer 4 is connected with the contact electrode 43b of the source region 43 via the diffusion resistance layer 46 and the switch means 47 is described. In a third embodiment, with the laminated structure of the above-mentioned first and second embodiments or instead of this laminated structure, a case where a ferroelectric film having a dielectric polarization characteristic is disposed to be opposed to a channel region of a MOS transistor is described. In this case, the gate electrode 81 of the MOS transistor and another gate electrode 82 (the high-concentration impurity diffusion layer 42 for charge fixing may be provided or does not have to be provided) may be separately provided as the above-described first and second embodiments. However, in this example, only a gate electrode of a MOS transistor is provided and the high-concentration impurity diffusion layer 42 for charge fixing which is positioned under another gate electrode 82 is not provided.

Figure 8:
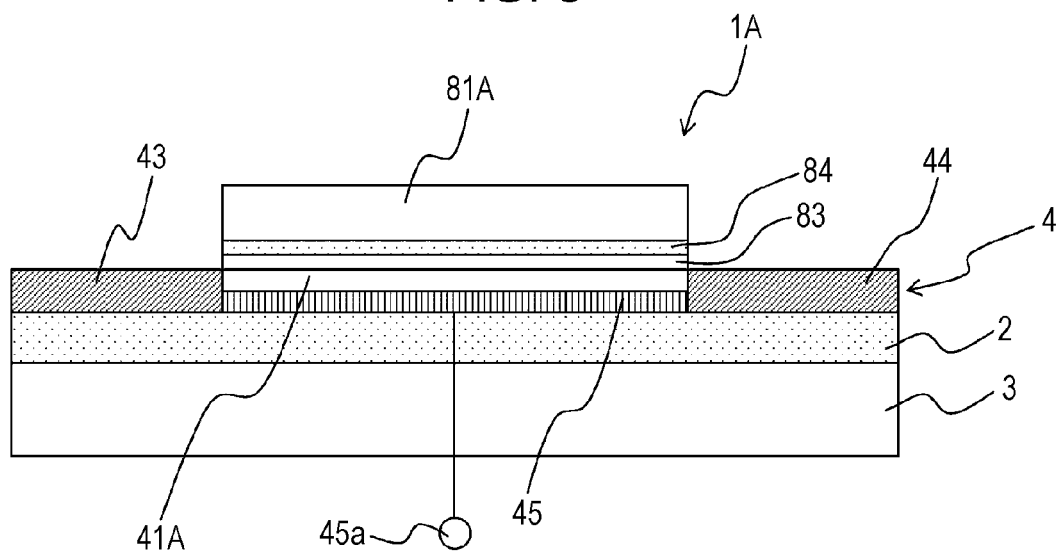
FIG. 8 is a sectional view illustrating an example of the configurations of chief portions of a semiconductor device for radiation detection which has the SOI structure according to a third embodiment of the present invention.

FIG. 8 is a sectional view illustrating an example of the configurations of chief portions of a semiconductor device for radiation detection which has the SOI structure according to the third embodiment of the present invention.

In FIG. 8, in a semiconductor device 1A for radiation detection which has the SOI structure according to this third embodiment, a laminated structure of the insulator layer of the silicon nitride film 83 and the silicon oxide film 84 which are provided directly under a gate electrode 81A and a ferroelectric film 45 which is opposed to the laminated structure with a channel region 41A interposed therebetween are disposed so as to enable execution of threshold value correction for reducing threshold value variation of a MOS transistor. Thus, in the semiconductor device TA for radiation detection according to this third embodiment, the ferroelectric film 45 is disposed directly under the channel region 41A so as to be able to change and adjust the threshold value by using the polarization characteristic of dielectric polarization.

As a material of the ferroelectric film 45 which is disposed on a lower surface portion of the channel region 41A, lead zirconate titanate (PZT(Pb(Zr,Ti)O$_3$)), lead lanthanum zirconate titanate £PLZT((Pb,La)(Zr,Ti)O$_3$)), barium titanate (BaTiO$_3$), or the like can be used, in particular.

On the insulator layer 2 of the SOI structure which is composed of the thick single-crystal silicon layer 3, the insulator layer 2, and the thin single-crystal silicon layer 4 provided from the bottom, the source region 43 and the drain region 44 are arranged on right and left sides of two layers which are the channel region 41A and the ferroelectric film 45 which are provided under the lamination of the silicon nitride film 83 and the silicon oxide film 84 which are provided directly under the gate electrode 81A of the MOS transistor.

Due to the above-mentioned configuration, when a predetermined voltage is applied to the ferroelectric film 45 provided directly under this channel region 41A from the input terminal 45a, charges are generated on a surface of the ferroelectric film 45 due to dielectric polarization. By these generated charges, an electric field can be applied to the channel region 41A of the MOS transistor which is formed in the single-crystal silicon layer 4 on the upper side and a threshold value can be varied. A voltage to be applied to the ferroelectric film 45 may be applied by providing a gate electrode to the channel region 41 of the MOS transistor as is the case with the above-described first embodiment or may be applied by using a contact electrode of the source region 43 or the drain region 44 constituting a driving region. Further, a high voltage in an extent that dielectric breakdown of the silicon oxide film 84 under the gate electrode 81A does not occur is directly applied to the gate electrode 81A so as to be able to generate charges on the surface of the ferroelectric film 45 without directly applying a voltage to the ferroelectric film 45 and correction for reduction of threshold value variation of a MOS transistor is enabled.

Thus, according to this third embodiment, the semiconductor device 1A for radiation detection which is capable of easily reducing variation in threshold voltages and, in addition, capable of correcting and controlling threshold value variation with the simple configuration, without requiring an additional circuit which exerts influence on a pixel size, so as to obtain a highly-precise circuit characteristic can be realized. Thus, variation in threshold voltages in a device operation can be reduced.

Here, such configuration is employed in this third embodiment that the laminated structure is disposed on the upper surface of the channel region 41A with the laminated structure of insulators which are the silicon nitride film 83 and the silicon oxide film 84 and the ferroelectric film 45 is disposed on the lower surface of the channel region 41A so as to reduce threshold value variation of the MOS transistor, but the configuration is not limited to this. Such configuration may be also employed that the ferroelectric film 45 is disposed on the upper surface or/and the lower surface of the channel region 41A instead of the laminated structure of insulators which are the silicon nitride film 83 and the silicon oxide film 84 (or without providing the laminated structure) so as to reduce threshold value variation of the MOS transistor.

In short, in this third embodiment, the ferroelectric film 45 which has the dielectric polarization characteristic may be disposed to be opposed to the channel region 41A of the MOS transistor, with this laminated structure or instead of this laminated structure.

Fourth Embodiment

In the above-described first embodiment, the case where the gate electrode 82 to which a signal inverted via the CMOS circuit 80 is inputted and the gate electrode 81 of the MOS transistor are arranged in the crosswise direction above the channel region 41 is described. In this fourth embodiment, a case of a laminated structure in which a MOS transistor and a MOS capacitor means (poly capacitor) for signal inversion are laminated in the longitudinal direction is described.

Figure 9:
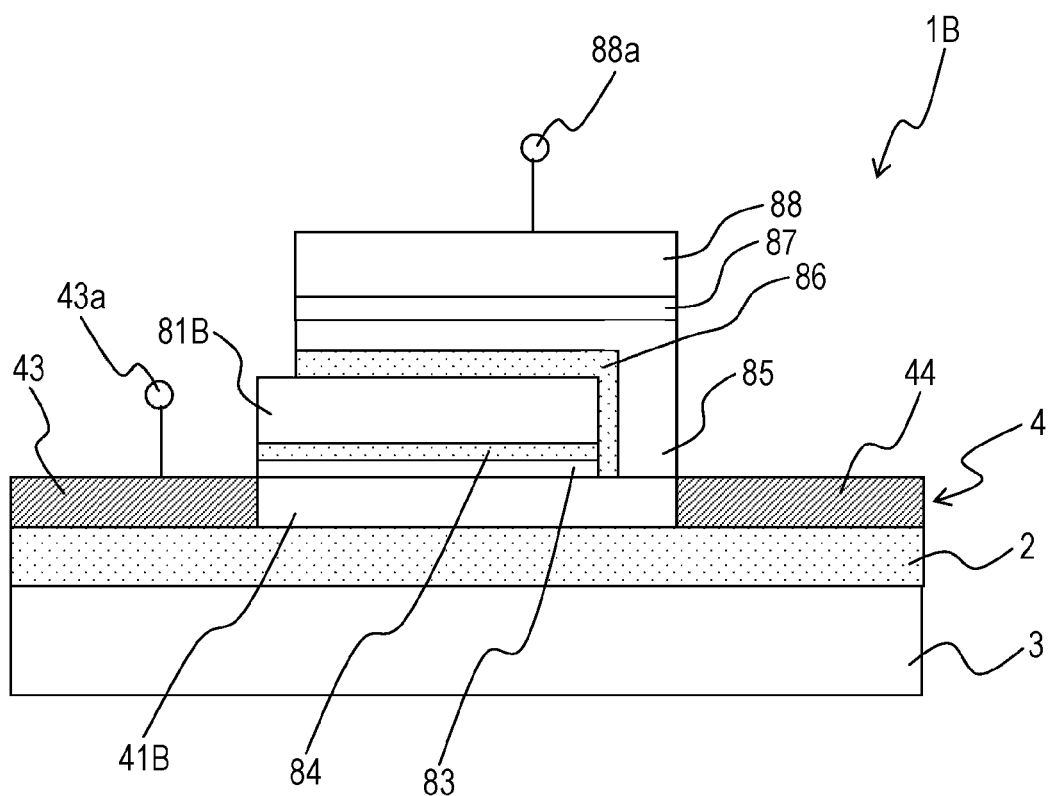
FIG. 9 is a sectional view illustrating an example of the configurations of chief portions of a semiconductor device for radiation detection which has the SOI structure according to a fourth embodiment of the present invention.

FIG. 9 is a sectional view illustrating an example of the configurations of chief portions of a semiconductor device for radiation detection which has the SOI structure according to the fourth embodiment of the present invention.

In FIG. 9, in a semiconductor device 1B for radiation detection which has the SOI structure according to this fourth embodiment, a first poly silicon film 85 of a MOS capacitor in which an input signal which is inputted into an input terminal 88a is always inverted is provided on a channel region 41B from an upper surface and one lateral surface of a gate electrode 81B with an interlayer insulation film 86 interposed in a manner to be adjacent to the gate electrode 81B of the MOS transistor. A signal obtained by inverting an input signal inputted into the source region 43 of the MOS transistor through an input terminal 43a is provided to the channel region 41B of the MOS transistor from the first poly silicon film 85 via the MOS capacitor. Accordingly, fluctuation, which occurs in association with an input signal, of a channel potential of the channel region 41B of the MOS transistor can be suppressed, a stable transistor operation can be realized, and a threshold value of the MOS transistor can be arbitrarily adjusted.

On the insulator layer 2 of the SOI structure which is composed of the thick single-crystal silicon layer 3, the insulator layer 2, and the thin single-crystal silicon layer 4 provided from the bottom, the source region 43 and the drain region 44 are arranged on right and left sides of the channel region 41B which is opposed to the first poly silicon film 85 which is provided under the lamination of the silicon nitride film 83 and the silicon oxide film 84, which are provided directly under the gate electrode 81B of the MOS transistor, with the interlayer insulation film 86 interposed.

As an inverted signal input unit which inputs a signal obtained by inverting an input signal inputted into the source region 43 of the MOS transistor into the channel region 41B, a MOS capacitor means which includes the first poly silicon film 85 and a second poly silicon film 88 as another gate electrode is formed to input an input signal; which is inputted into the source region 43 of the MOS transistor, into another gate electrode (the second poly silicon film 88) and input the inverted signal of the input signal into the channel region 41B. In the MOS capacitor means, the first poly silicon film 85 is an impurity diffusion region which is connected with an extended end portion of the channel region 41B below the gate electrode 81B in a manner to be adjacent to the gate electrode 81B of the MOS transistor and contains the identical type of impurity to that of the channel region 41B, and the second poly silicon film 88 is provided above the first poly silicon film 85, which is the impurity diffusion region, with a dielectric film 87 interposed.

As the MOS capacitor means of the semiconductor device 1B for radiation detection, a poly capacitor which includes an electrode pair composed of the first poly silicon film 85 and the second poly silicon film 88 is provided. The first poly silicon film 85 is formed to be connected with an end portion of the channel region 41B in a manner to be adjacent to the gate electrode 81B, which constitutes the MOS transistor, for the MOS transistor, and the second poly silicon film 88 is disposed above the first poly silicon film 85 which is formed, with the interlayer insulation film 86 interposed, from the upper surface and one lateral surface of the gate electrode 81B with the dielectric film 87 further interposed.

In this semiconductor device 1B for radiation detection, the poly capacitor is formed on the MOS transistor with the interlayer insulation film 86 interposed and thus, the MOS transistor and the poly capacitor form the laminated structure in the longitudinal direction. In addition to this, capacitance of the poly capacitor in which the dielectric film 87 is sandwiched by the first poly silicon film 85 provided on the lower side and the second poly silicon film 88 provided on the upper side can be set to a desired value as well by changing the type or the thickness of the dielectric film 87.

At this time, an input signal to be inputted into the source region 43 through the input terminal 43a is inputted also into the input terminal 88a and a signal inverted with respect to the input signal is applied to the channel region 41B from the first poly silicon film 85.

Thus, according to this fourth embodiment, the insulator layer disposed to be opposed to the channel region 41B of the MOS transistor is formed to have the laminated structure composed of the silicon nitride film 83 and the silicon oxide film 84. An inverted signal input unit which inputs a signal obtained by inverting an input signal inputted into the source region 43 of the MOS transistor into the channel region 41B is provided. As this inverted signal input unit, a MOS capacitor means which includes an impurity diffusion region (the first poly silicon film 85) and another gate electrode (the second poly silicon film 88) is formed to input an input signal, which is inputted into the source region 43 of the MOS transistor, into another gate electrode (the second poly silicon film 88) and input the inverted signal of the input signal into the channel region 41B from the impurity diffusion region (the first poly silicon film 85). In the MOS capacitor means, the impurity diffusion region (the first poly silicon film 85) is connected with an extended portion of the channel region 41B below the gate electrode 81B in a manner to be adjacent to the gate electrode 81B of the MOS transistor and contains the identical type of impurity to that of the channel region 41B, and another gate electrode (the second poly silicon film 88) is provided above the impurity diffusion region with the dielectric film 87 or an insulation film interposed.

Accordingly, the semiconductor device 1B for radiation detection which is capable of easily reducing variation in threshold voltages and, in addition, capable of correcting and controlling threshold value variation with the simple configuration, without requiring an additional circuit which exerts influence on a pixel size, so as to obtain a highly-precise circuit characteristic can be realized. Thus, variation in threshold voltages in a device operation can be reduced.

Fifth Embodiment

In the above-described fourth embodiment, the case where the laminated structure in which the gate electrode 81B of the MOS transistor and the MOS capacitor means for signal inversion (the poly capacitor) are laminated in the longitudinal direction is described. In this fifth embodiment, such case is described that, on a predetermined position of the impurity diffusion region provided below a gate electrode of a MOS capacitor means, a high-concentration impurity diffusion layer the impurity concentration of which is higher than that of the impurity diffusion region is formed by additionally introducing the identical type of impurity, in addition to the structure of the third embodiment.

Figure 10:
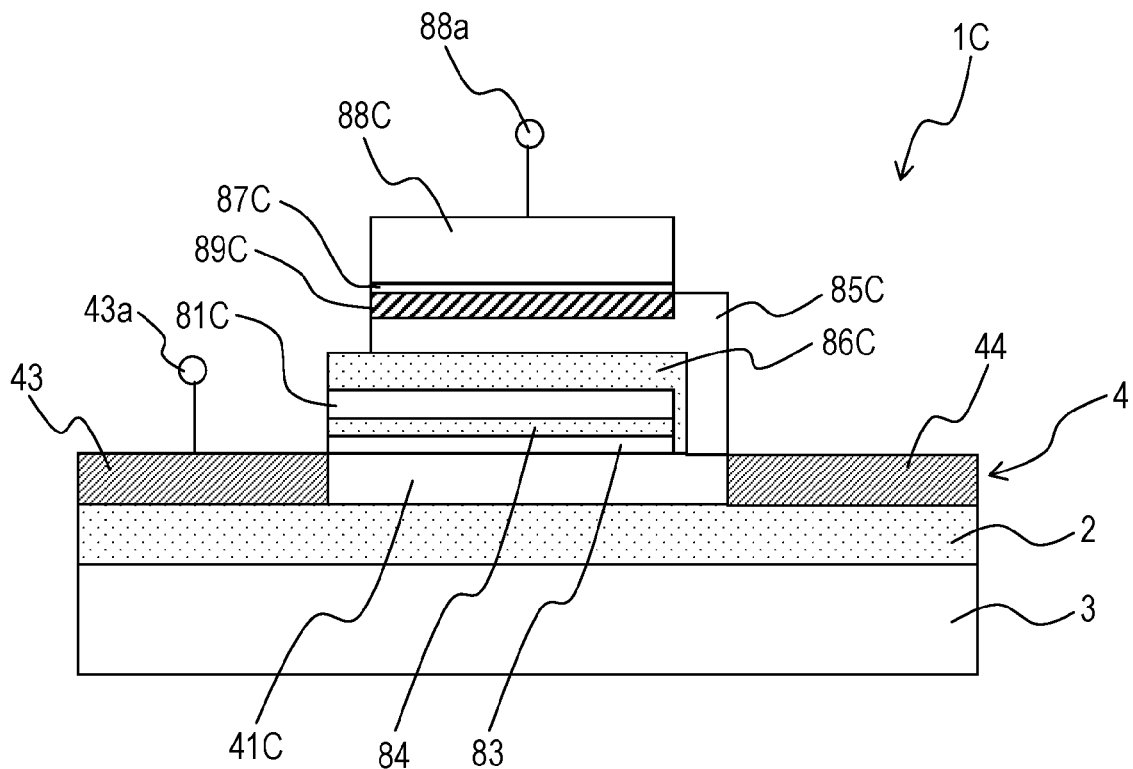
FIG. 10 is a sectional view illustrating an example of the configurations of chief portions of a semiconductor device for radiation detection which has the SOI structure according to a fifth embodiment of the present invention.

FIG. 10 is a sectional view illustrating an example of the configurations of chief portions of a semiconductor device for radiation detection which has the SOI structure according to the fifth embodiment of the present invention.

In FIG. 10, in a semiconductor device 1C for radiation detection which has the SOI structure according to this fifth embodiment, a first poly silicon film 85C is disposed such that a MOS capacitor means for signal inversion is connected to an end portion of a channel region 41C in a manner to be adjacent to a gate electrode 81C for a MOS transistor which constitutes the MOS transistor. The first poly silicon film 85C is disposed above and on one lateral side of the gate electrode 81C for a MOS transistor with an interlayer insulation film 86C interposed. A second poly silicon film 88C is disposed as another gate electrode (a gate electrode of the MOS capacitor means) above the first poly silicon film 85C with a dielectric film 87C interposed. The MOS capacitor means is formed above the gate electrode 81C of the MOS transistor to form a longitudinal laminated structure of the MOS transistor and the MOS capacitor means. In addition to this, on a surface of the first poly silicon film 85C provided directly under the second poly silicon film 88C, which is the gate electrode for a MOS capacitor constituting the MOS capacitor means, with the dielectric film 87C interposed, a high-concentration impurity diffusion layer 89C for charge fixing the concentration of which is increased by further introducing an identical type of impurity (a high-concentration impurity diffusion region) is formed. Accordingly, the MOS capacitor means can be constantly maintained on a fixed potential, so that an inverted potential which corresponds to an input signal inputted into the input terminal 43a can be provided from the first poly silicon film 85C to the channel region 41C of the MOS transistor and thus, an operation of the MOS transistor can be further stabilized.

At this time, the input signal to be inputted into the source region 43 through the input terminal 43a is inputted also into an input terminal 88a and an inverted signal with respect to the input signal is applied on the channel region 41C.

In this case as well, the laminated structure of insulators which are the silicon nitride film 83 and the silicon oxide film 84 is provided between the channel region 41C and the gate electrode 81C for a MOS transistor.

Thus, according to this fifth embodiment, the insulator layer which is disposed to be opposed to the channel region 41C of the MOS transistor is formed to have the laminated structure composed of the silicon nitride film 83 and the silicon oxide film 84. An inverted signal input unit which inputs a signal obtained by inverting an input signal inputted into the source region 43 of the MOS transistor into the channel region 41C is provided. As this inverted signal input unit, a MOS capacitor means which includes an impurity diffusion region (the first poly silicon film 85C) and another gate electrode (the second poly silicon film 88C) is formed to input an input signal, which is inputted into the source region 43 of the MOS transistor, into another gate electrode (the second poly silicon film 88C) and input the inverted signal of the input signal into the channel region 41C from the impurity diffusion region (the first poly silicon film 85C). In the MOS capacitor means, the impurity diffusion region (the first poly silicon film 85C) is connected with an extended portion of the channel region 41C below the gate electrode 81C in a manner to be adjacent to the gate electrode 81C of the MOS transistor and contains the identical type of impurity to that of the channel region 41C, and another gate electrode (the second poly silicon film 88C) is provided above the impurity diffusion region with the dielectric film 87C or an insulation film interposed. Further, on a position of the impurity diffusion region (the first poly silicon film 85C) provided below another gate electrode (the second poly silicon film 88C), the high-concentration impurity diffusion layer 89C the impurity concentration of which is higher than that of the impurity diffusion region (the first poly silicon film 85C) is formed by additionally introducing an identical type of impurity.

Accordingly, the semiconductor device 10 for radiation detection which is capable of constantly maintaining the MOS capacitor means at a fixed potential by the high-concentration impurity diffusion layer 89C for charge fixing, easily reducing variation in threshold voltages, and in addition, correcting and controlling threshold value variation with the simple configuration, without requiring an additional circuit which exerts influence on a pixel size, so as to obtain a highly-precise circuit characteristic can be realized. Thus, variation in threshold voltages in a device operation can be reduced.

Sixth Embodiment

In the third embodiment, the case where the ferroelectric film 45 which has the dielectric polarization characteristic is disposed to be opposed to the channel region 41A of the MOS transistor with or instead of the insulator layer which is disposed to be opposed to the channel region 41 in the MOS transistor and is formed to have the laminated structure of the silicon nitride film 83 and the silicon oxide film 84 in the above-described first embodiment is described. In this sixth embodiment, a case where as an inverted signal input unit, an electrode film is disposed, with the laminated structure of the silicon nitride film 83 and the silicon oxide film 84, in the insulator layer 2 which is opposed to the laminated structure of the silicon nitride film 83 and the silicon oxide film 84 with a channel region 41D interposed and an input signal inputted into the source region 43 of the MOS transistor is inputted into the electrode film provided in the insulator layer 2 so as to input an inverted signal of the input signal into the channel region 41D is described.

Figure 11:
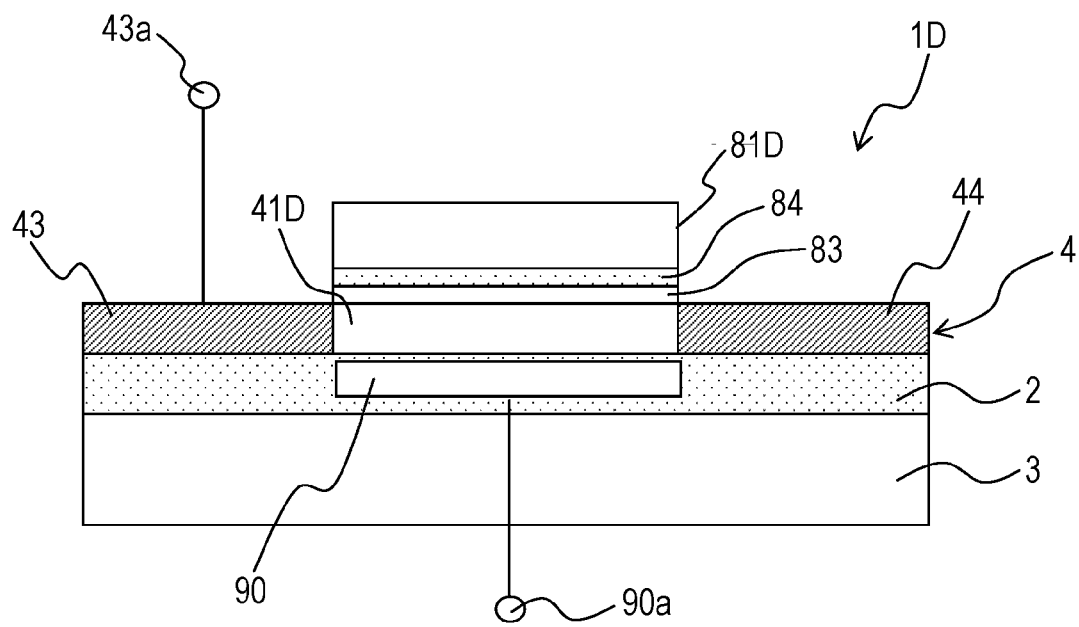
FIG. 11 is a sectional view illustrating an example of the configurations of chief portions of a semiconductor device for radiation detection which has the SOI structure according to a sixth embodiment of the present invention.

FIG. 11 is a sectional view illustrating an example of a semiconductor device for radiation detection which has the SOI structure according to the sixth embodiment of the present invention.

In FIG. 11, a semiconductor device 10 for radiation detection which has the SOI structure according to this sixth embodiment includes the laminated structure, which is provided directly under the gate electrode 81D, of insulators which are the silicon nitride film 83 and the silicon oxide film 84 and a poly silicon film 90 which serves as an electrode film and is disposed in the insulator layer 2 which is opposed to the laminated structure with a channel region 41D interposed.

The film thickness of the silicon oxide film, between the poly silicon film 90 serving as a gate electrode for a MOS capacitor which is a back gate and the channel region 41D, of the insulator layer 2 is set to be approximately as thin as the film thickness of a gate silicon oxide film. Accordingly, a potential corresponding to an input signal inputted into an input terminal 90a can be directly provided to the whole of the channel region 41D from the poly silicon film 90 and thus, potential fluctuation of the channel region 41D can be efficiently suppressed.

At this time, an input signal to be inputted into the source region 43 through the input terminal 43a is inputted also into the input terminal 90a and a signal inverted with respect to the input signal is applied to the channel region 41D from the lower side from the poly silicon film 90 via the silicon oxide film.

Thus, according to this sixth embodiment, the laminated structure of the silicon nitride film 83 and the silicon oxide film 84 and the poly silicon film 90 which serves as an electrode film and is formed in the insulator layer 2 which is opposed to the laminated structure with the channel region 41D interposed are arranged and an input signal inputted into the source region 43 of the MOS transistor is inputted into the poly silicon film 90 formed in the insulator layer 2 so as to input a voltage signal obtained by inverting the input signal into the channel region 41D from the poly silicon film 90 via the thin film of the insulator layer 2.

Thus, the laminated structure of the silicon nitride film 83 and the silicon oxide film 84 disposed directly under the gate electrode 81D and the poly silicon film 90 which is formed in the inside of the insulator layer 2, which is opposed to the laminated structure with the channel region 41D interposed, are arranged so that the semiconductor device 1D for radiation detection which is capable of easily reducing variation in threshold voltages and, in addition, correcting and controlling threshold value variation with the simple configuration, without requiring an additional circuit which exerts influence on a pixel size, so as to obtain a highly-precise circuit characteristic can be realized. Thus, variation in threshold voltages in a device operation can be reduced.

Seventh Embodiment

In the above-described fourth embodiment, the case of the laminated structure in which the MOS transistor and the MOS capacitor means (poly capacitor) for signal inversion are laminated in the longitudinal direction is described. In this seventh embodiment, a case where a capacitor means for signal inversion is disposed on a position on an interlayer insulation layer 71 which is separated from a MOS transistor in a state in which the capacitor means is connected with an end portion of a channel region 41E of the MOS transistor with a contact electrode interposed is described.

Figure 12:
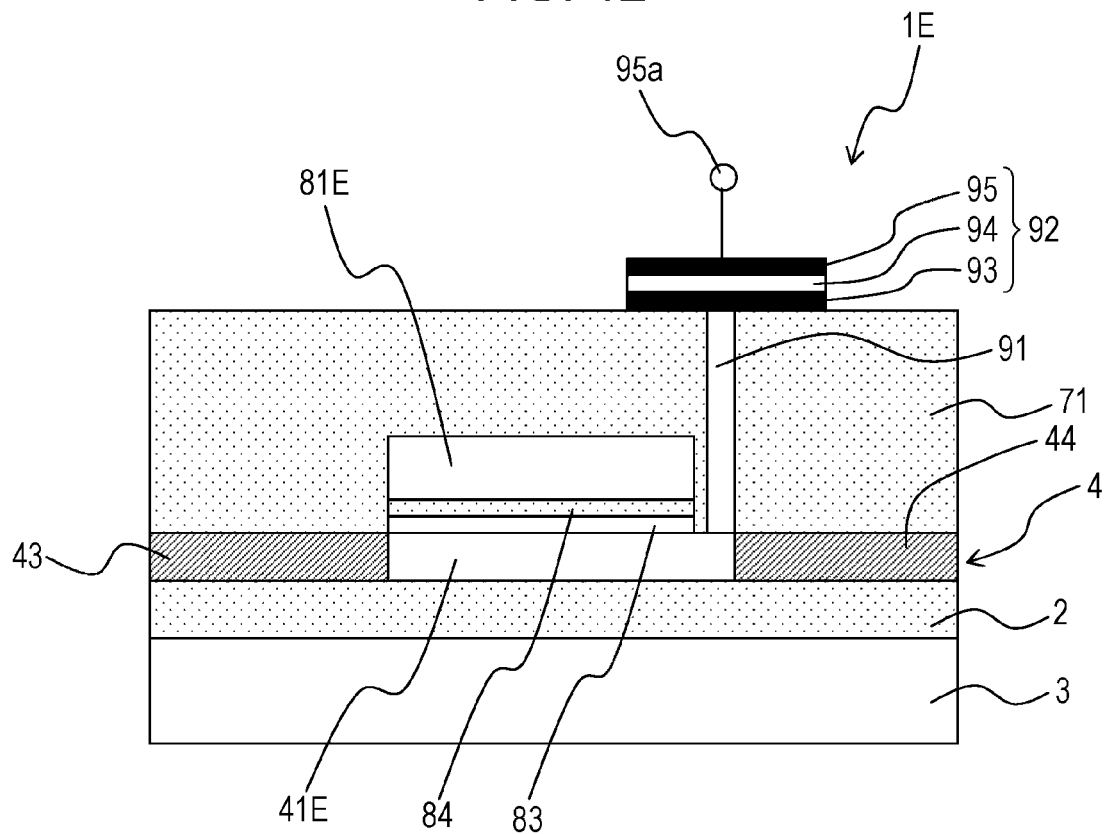
FIG. 12 is a sectional view illustrating an example of the configurations of chief portions of a semiconductor device for radiation detection which has the SOI structure according to a seventh embodiment of the present invention.

FIG. 12 is a sectional view illustrating an example of the configurations of chief portions of a semiconductor device for radiation detection which has the SOI structure according to the seventh embodiment of the present invention.

In FIG. 12, a semiconductor device 1E for radiation detection which has the SOI structure according to this seventh embodiment includes a contact electrode 91 which is made of a poly silicon material and a capacitor means 92 which is provided on the interlayer insulation film 71. The contact electrode 91 is embedded in a through hole, which penetrates the interlayer insulation film 71 and is a longitudinal hole, in a manner to be adjacent to a gate electrode 81E for a MOS transistor. One end of the contact electrode 91 is connected on an end portion of the channel region 41E which is an impurity diffusion region and the other end of the contact electrode 91 is connected to the capacitor means 92.

The capacitor means 92 includes a lower-side metal electrode 93 which is connected with the contact electrode 91 which is made of a longitudinal poly silicon material, a dielectric film 94 provided on the lower-side metal electrode 93, and an upper-side metal electrode 95 which is provided on the dielectric film 94 and to which an input terminal 95a is connected. Metal films of the metal electrodes 93 and 95 make an electrode pair in a manner to sandwich the dielectric film 94 from the top and the bottom. This is a metal-insulator-metal (MIM) structure in which the dielectric film 94 is sandwiched by metal.

The capacitor means 92 constitutes an inverted signal input unit which inputs an input signal to be inputted into the source region 43 of the MOS transistor into the input terminal 95a as well and inputs a signal obtained by inverting the input signal into the channel region 41E from the contact electrode 91.

A MIM capacitor constituting this capacitor means 92 has small resistance and the capacity density thereof can be increased, so that potential fluctuation of the channel region 41E can be efficiently suppressed. The dielectric film 94 is preferably composed of a ferroelectric film made of a material having a high dielectric constant such as tantalum pentoxide $Ta_2O_5$), hafnium oxide ($HfO_2$), and aluminum oxide ($Al_2O_3$) in the light of higher capacity. Here, it is obvious that the dielectric material of the dielectric film 94 is not limited to the above-mentioned various materials and materials other than those mentioned above may be used.

Thus, according to this seventh embodiment, a longitudinal impurity diffusion region (the contact electrode 91) which contents an identical type of impurity to that of the channel region 41E is provided to be adjacent to the gate electrode 81E of the MOS transistor in such state that one end thereof is connected to an extended portion of the channel region 41E, which is provided below the gate electrode 81E, and the longitudinal impurity diffusion region (the contact electrode 91) penetrates the interlayer insulation layer 71 in which the gate electrode 81E and the channel region 41E are embedded. Further, the capacitor means 92 which is electrically connected to the other end of the impurity diffusion region (the contact electrode 91) and in which the metal electrodes 93 and 95, which are the metal films, sandwich the dielectric film 94 to form an electrode pair is provided on the interlayer insulation layer 71. An input signal into the source region 43 of the MOS transistor is inputted into the capacitor means 92 and an inverted signal of the input signal is inputted into the channel region 41E from the contact electrode 91.

Accordingly, such semiconductor device 1E for radiation detection can be realized that inputs an input signal to be inputted into the source region 43 of the MOS transistor into the input terminal 95a and inputs a signal obtained by inverting the input signal into the channel region 41E from the contact electrode 91 by the capacitor means 92 so as to be able to easily reduce variation in threshold voltages with the laminated structure of the silicon nitride film 83 and the silicon oxide film 84 directly under the gate electrode 81E, and in addition, is capable of correcting and controlling threshold value variation with the simple configuration, without requiring an additional circuit which exerts influence on a pixel size, so as to obtain a highly-precise circuit characteristic. Thus, variation in threshold voltages in a device operation can be reduced.

In this seventh embodiment, the case where the capacitor means 92 for signal inversion is disposed on the interlayer insulation layer 71 in a manner to be connected with the end portion of the channel region 41E of the MOS transistor via the contact electrode 91 is described, but the configuration is not limited to this. Such configuration may be employed that a capacitor means is provided as an inverted signal input unit in a manner to be adjacent to the gate electrode 81E of the MOS transistor and an input signal to be inputted into the source region 43 of the MOS transistor is inputted also into the capacitor means to input an inverted signal of the input signal into the channel region from the metal film. In the capacitor means, another metal film (which corresponds to the metal electrode 95) is disposed on a metal film (which corresponds to the metal electrode 93) which is connected to the extended end portion of the channel region 41E provided below the gate electrode 81E with the insulation film interposed and thus, the electrode pair is made. In short, this is a case where the contact electrode 91 in which an impurity diffusion region material is embedded is not provided in the capacitor means 92 of FIG. 1012, that is, a case where the lower-side metal film of the capacitor means 92 is directly connected on the extended end portion of the channel region 41E.

In the above-described second embodiment, such case is described that in the configuration in which the back gate electrode 48 of the single-crystal silicon layer 4 and the source region 43 are connected with each other with the diffusion resistance layer 46 interposed so that a potential can be supplied, a part or the whole of the insulator layer which is disposed to be opposed to the channel region of the MOS transistor is formed to have the laminated structure composed of the semiconductor oxide film and the silicon nitride film and a voltage signal inverted in the CMOS circuit serving as the inverted signal input unit is inputted into another gate electrode 82, but the configuration is not limited to this. The configuration of the above-described second embodiment in which the back gate electrode 48 of the single-crystal silicon layer 4 and the source region 43 are connected with each other with the diffusion resistance layer 46 interposed so that a potential can be mutually supplied may be combined with that of any of the above-described embodiments 3 to 7. Further, the configuration of the above-described second embodiment in which the back gate electrode 48 of the single-crystal silicon layer 4 and the source region 43 are connected with each other with the diffusion resistance layer 46 interposed so that a potential can be supplied and the configuration in which a part or the whole of the insulator layer which is disposed to be opposed to the channel region 41 of the MOS transistor is formed to have the laminated structure composed of the silicon oxide film 84 or a film which traps and holds electrons or holes equivalently to the silicon oxide film 84 and a film which traps electrons or holes more easily than the silicon oxide film 84 (for example, the silicon nitride film 83) may be included.

Here, various alterations can be made with respect to the embodiments 1 to 7 of the present invention within the scope described in Claims. That is, embodiments which are obtained by further combining technical means which is arbitrarily altered within the scope of Claims of the present application are also included in the technical scope of the present invention. Further, at least two of the above-described embodiments 1 to 7 may be combined.

Thus, the present invention has been illustrated by using the preferable embodiments 1 to 7 of the present invention, but the present invention should not be interpreted limitedly to these embodiments 1 to 7. It is understood that the scope of the present invention should be interpreted only by Claims. It can be understood by those skilled in the art that embodiments in an equivalent scope can be made based on the description of the present invention and common general technical knowledge on the basis of the description of the preferable and specific embodiments 1 to 7 of the present invention. It can be understood that contents of patents, applications of patent, and patent literatures referred in this specification should be incorporated as a reference with respect to the present specification as the contents thereof are specifically described in the present specification.

INDUSTRIAL APPLICABILITY

In the present invention, the inverted signal input unit inputs a signal obtained by inverting an input signal inputted into one drive region of a MOS transistor into a channel region, so that variation in threshold voltages in a bias operation can be reduced, in a field of semiconductor devices for radiation detection in which a radiation detection element and a read circuit for the radiation detection element are formed on one silicon-on-insulator (SOI) substrate in a manner to be separated from each other by an insulation film and active elements such as a MOS transistor which constitutes this read circuit and passive elements such as a resistor and a capacitor are mounted. Thus, the semiconductor device for radiation detection having the SOI structure according to the present invention is configured such that a radiation detection element is constructed in a single-crystal silicon film layer of the lower side, so as to be favorably used for detection of radiation such as an alpha ray, a beta ray, a gamma ray, an X-ray, a neutron beam, and a charged particle beam.

The invention claimed is:

1. A semiconductor device for radiation detection which has a silicon-on-insulator (SOI) structure in which a first semiconductor layer or a semiconductor substrate is disposed on a lower surface of an insulator layer and a second semiconductor layer is disposed on an upper surface of the insulator layer, in which
    a radiation detection element is formed on the first semiconductor layer or the semiconductor substrate, and
    a read circuit which processes a signal charge, the signal charge being detected in the radiation detection element, and includes at least a MOS transistor is formed on the second semiconductor layer,
    the semiconductor device for radiation detection, comprising:
    an inverted signal input unit which inputs a signal obtained by inverting an input signal inputted into one drive region of the MOS transistor into a channel region of the MOS transistor; wherein
    a part or a whole of the insulator layer which is disposed to be opposed to the channel region of the MOS transistor is formed to have a laminated structure of a silicon oxide film or a film which traps and holds an electron or a hole equivalently to the silicon oxide film and a film which traps an electron or a hole more easily than the silicon oxide film.

2. The semiconductor device for radiation detection according to claim 1, wherein the inverted signal input unit includes another gate electrode which is formed on an extended portion of a channel region of a gate electrode of the MOS transistor in a manner to be adjacent to the gate electrode and a CMOS circuit which inverts an input signal inputted into one drive region of the MOS transistor by each predetermined voltage in accordance with an input value of the input signal, and inputs a voltage signal obtained through inversion in the CMOS circuit into the another gate electrode.

3. The semiconductor device for radiation detection according to claim 1, wherein the inverted signal input unit inputs an input signal to be inputted into a source region of the MOS transistor also into a capacitor means so as to input an obtained inverted signal from the capacitor means into the channel region.

4. The semiconductor device for radiation detection according to claim 1, wherein a ferroelectric film which has a dielectric polarization characteristic is disposed to be opposed to the channel region of the MOS transistor, as the inverted signal input unit constituted with the laminated structure or instead of the laminated structure.

5. The semiconductor device for radiation detection according to claim 1, wherein an electrode film is disposed in an inside of the insulator layer, the insulator layer being opposed to the laminated structure with a channel region interposed, as the inverted signal input unit constituted with the laminated structure and a signal which is obtained by inverting an input signal, the input signal being inputted into one drive region of the MOS transistor, is inputted into the channel region by an insulator layer on a side of the channel region from the electrode film, the electrode film being provided in the inside of the insulator layer.

6. The semiconductor device for radiation detection according to claim 1, wherein a back gate electrode of the second semiconductor layer and the source region are connected with each other with a diffusion resistance layer interposed so that a potential can be supplied.

* * * * *